United States Patent
Polakowski

(10) Patent No.: US 11,594,542 B2
(45) Date of Patent: Feb. 28, 2023

(54) REMANENT POLARIZABLE CAPACITIVE STRUCTURE, MEMORY CELL, AND METHODS THEREOF

(71) Applicant: Ferroelectric Memory GmbH, Dresden (DE)

(72) Inventor: Patrick Polakowski, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 245 days.

(21) Appl. No.: 17/072,888

(22) Filed: Oct. 16, 2020

(65) Prior Publication Data
US 2022/0122999 A1     Apr. 21, 2022

(51) Int. Cl.
*H01L 27/11507* (2017.01)
*H01L 29/78* (2006.01)
(Continued)

(52) U.S. Cl.
CPC ........ *H01L 27/11507* (2013.01); *H01L 28/60* (2013.01); *H01L 29/0673* (2013.01);
(Continued)

(58) Field of Classification Search
CPC ......... H01L 21/02181; H01L 21/02189; H01L 21/02603; H01L 21/823431; H01L 21/823821; H01L 21/845; H01L 27/0886; H01L 27/0924; H01L 27/10879; H01L 27/11507; H01L 27/11502; H01L 27/1159; H01L 27/1211; H01L 28/40; H01L 28/60; H01L 29/0665; H01L 29/0669; H01L 29/0673; H01L 29/40111; H01L 29/41791; H01L 29/42392; H01L 29/516;
(Continued)

(56) References Cited

U.S. PATENT DOCUMENTS

2008/0025065 A1\* 1/2008 Kim ........................ G11C 11/22
365/145
2008/0073680 A1\* 3/2008 Wang ................ H01L 27/11502
257/295

(Continued)

OTHER PUBLICATIONS

S. Riedel "A thermally robust and thickness independent ferroelectric phase in laminated hafnium zirconium oxide", AIP Advances, dated Oct. 5, 2016, 11 pages.
(Continued)

*Primary Examiner* — David C Spalla
(74) *Attorney, Agent, or Firm* — Hickman Becker Bingham Ledesma LLP; Malgorzata A Kulczycka

(57) ABSTRACT

According to various aspects, a method of forming one or more remanent-polarizable capacitive structures, the method including forming one or more capacitive structures, each of the one or more capacitive structures includes: one or more electrodes, one or more precursor structures disposed adjacent to the one or more electrodes, wherein each of the one or more precursor structures has a first dimension in a range from about 1 nm to 100 nm and a second dimension in a range from about 1 nm to about 30 nm; and, subsequently, forming one or more remanent-polarizable structures comprising a crystalline remanent-polarizable material based on a crystallization of a precursor material of the one or more precursor structures.

19 Claims, 11 Drawing Sheets

(51) Int. Cl.
  *H01L 29/786* (2006.01)
  *H01L 29/423* (2006.01)
  *H01L 29/06* (2006.01)
  *H01L 49/02* (2006.01)

(52) U.S. Cl.
  CPC .... *H01L 29/42392* (2013.01); *H01L 29/7851* (2013.01); *H01L 29/78696* (2013.01)

(58) Field of Classification Search
  CPC ......... H01L 29/66439; H01L 29/66795; H01L 29/6681; H01L 29/775; H01L 29/785; H01L 29/7851; H01L 29/7853; H01L 29/7855; H01L 29/78391; H01L 29/78696; H01L 2029/7858; H01L 2924/1441
  See application file for complete search history.

(56) References Cited

U.S. PATENT DOCUMENTS

| | | | |
|---|---|---|---|
| 2019/0108998 A1* | 4/2019 | Mueller-Meskamp | H01L 29/517 |
| 2019/0130956 A1* | 5/2019 | Müller | H01L 27/1159 |
| 2019/0348539 A1* | 11/2019 | Yoo | H01L 29/516 |
| 2021/0184043 A1* | 6/2021 | Chia | H01L 21/0228 |

OTHER PUBLICATIONS

K. Maekawa "Impact of Homogeneously Dispersed Al Nanoclusters by Si-monolayer Insertion into Hf0.5Zr0.5O2 Film on FeFET Memory Array with Tight Threshold Voltage Distribution", 1Device Technology Div., 2Process Production Technology Div., Renesas Electronics Corp, Hitachinaka, Ibaraki, Japan, © 2019 IEEE, 4 pages.

* cited by examiner

REMANENT POLARIZABLE CAPACITIVE STRUCTURE, MEMORY CELL, AND METHODS THEREOF

TECHNICAL FIELD

Various aspects relate to a remanent-polarizable capacitive structure, a memory cell, and methods thereof, e.g. a method of forming a capacitive structure or a memory cell.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. By way of example, a type of memory cell may include a thin film of ferroelectric material, whose polarization state may be changed in a controlled fashion to store data in the memory cell, e.g. in a non-volatile manner. The memory cells may be, for example, integrated on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
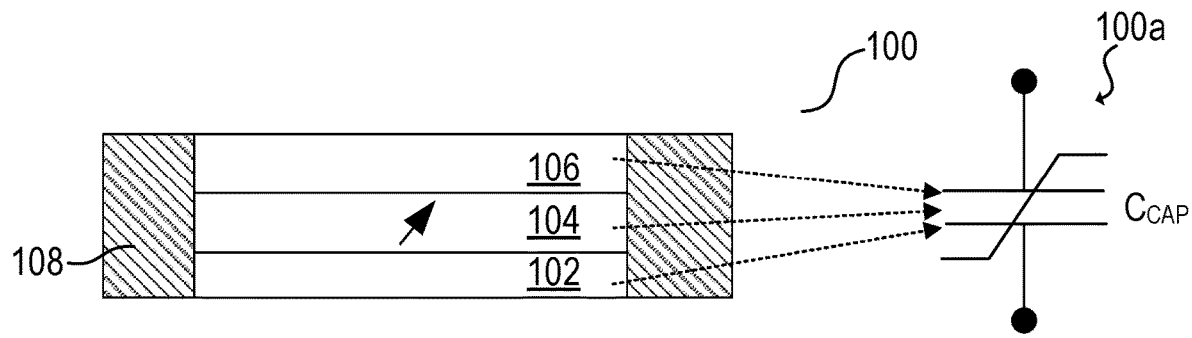
FIG. 1A to FIG. 1E show schematically a capacitive structure, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a field-effect transistor structure, a memory cell, or an electronic device). However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on at least one field-effect transistor (FET) structure. In some aspects, a memory cell may include a field-effect transistor structure and a capacitive structure coupled to a gate electrode of the field-effect transistor structure. The amount of charge stored in the capacitive structure may influence the threshold voltage(s) of the field-effect transistor structure. The threshold voltage(s) of the field-effect transistor structure may define the memory state the memory cell is residing in. In some aspects the capacitive structure may be a ferroelectric capacitor structure (FeCAP) coupled to a gate electrode of the field-effect transistor structure to provide a ferroelectric field-effect transistor (FeFET) structure. The term "ferroelectric" may be used herein, for example, to describe a material that shows a hysteretic charge voltage relationship (Q-V). Since a ferroelectric material may have at least two stable polarization states, it may be used to shift a threshold voltage of a field-effect transistor in a non-volatile fashion; therefore, it may be used to turn the field-effect transistor into a non-volatile field-effect transistor based memory structure. A ferroelectric material may turn a ferroelectric capacitor structure into a non-volatile capacitor based memory structure, e.g. by controlling the amount of charge stored in the capacitor structure.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on"

the implied side or surface with one or more additional layers being arranged between the implied side or surface and the formed layer.

The term "lateral" used with regards to a lateral dimension (in other words a lateral extent) of a structure, a portion, a structure element, a layer, etc., provided, for example, over and/or in a carrier (e.g. a layer, a substrate, a wafer, etc.) or "laterally" next to, may be used herein to mean an extent or a positional relationship along a surface of the carrier. That means, in some examples, that a surface of a carrier (e.g. a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. Further, the term "height" used with regards to a height of a structure, a portion, a structure element, a layer, etc., may be used herein to mean a dimension (in other words an extent) of a structure in a direction perpendicular to the surface of a carrier (e.g. perpendicular to the main processing surface of a carrier).

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The term region used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.,). In some aspects, the continuous region of a semiconductor portion may be provided by semiconductor material having only one dominant doping type.

The term "thickness" used with regards to a "thickness" of a layer may be used herein to mean the dimension (in other words an extent) of the layer perpendicular to the surface of the support (the material or material structure) on which the layer is formed (e.g., deposited or grown). If a surface of the support is parallel to the surface of the carrier (e.g. parallel to the main processing surface) the "thickness" of the layer formed on the surface of the support may be the same as the height of the layer.

FIG. 1A, FIG. 1B, FIG. 1C, FIG. 1D and FIG. 1E illustrate schematic cross-sectional views of capacitive structures 100 according to various aspects. In various aspects, a memory cell, as described in more detail below, may include a capacitive structure 100, as illustrated in FIG. 1A to FIG. 1E. In various aspects, a memory cell (e.g., memory cell 600 as described below) may further include a field-effect transistor structure. The field-effect transistor structure may include a gate electrode, wherein the gate electrode may be electrically conductively connected to the first electrode 102 of the capacitive structure 100, as illustrated, for example, in FIG. 6 and described in more detail below.

The capacitive structure 100 may include a first electrode 102, a second electrode 106, and at least one remanent-polarizable structure 104 disposed between the first electrode 102 and the second electrode 106. As illustrated by the circuit equivalent 100a in FIG. 1A, the first electrode 102, the second electrode 106 and the remanent-polarizable structure 104 may have a capacitance, $C_{CAP}$, associated therewith.

The at least one remanent-polarizable structure 104 may include at least one ferroelectric structure. As example, the at least one remanent-polarizable structure 104 may be or may include ferroelectric $HfO_2$. The remanent-polarizable structure 104 may have a single grain structure (illustrated by the arrow). A single grain structure may be a monocrystalline structure that is substantially free of amorphous regions. The remanent-polarizable structure 104 may have a ferroelectric dipole moment having an orientation in the range from about perpendicular (~90°) to about parallel (~1°) regarding the surface of the first electrode 102, e.g. in a range from about 10° to 90°, e.g. in a range from about 45° to about 90°.

The remanent-polarizable structure 104 may have a lateral extension in a range from about 1 nm to about 100 nm, e.g. in a range from about 1 nm to about 50 nm, e.g. in a range from about 5 nm to about 30 nm. The remanent-polarizable structure 104 may have a thickness in a range from about 1 nm to about 30 nm, e.g. in a range from about 2 nm to about 20 nm, e.g. in a range from about 2 nm to about 10 nm.

The lateral extension of the at least one remanent-polarizable structure 104 may be equal to or greater than the thickness of the at least one remanent-polarizable structure 104. Thus, the remanent-polarizable structure 104 may have an aspect ratio (relation of lateral extension regarding thickness) in a range from about 1 to about 3, according to various aspects.

The at least one remanent-polarizable structure 104 may include any type of remanent-polarizable and/or spontaneously-polarizable material, e.g., a ferroelectric material, an anti-ferroelectric material, an anti-ferroelectric-like material, etc.

The at least one remanent-polarizable structure 104 may form the functional structure of the capacitive structure 100 in a memory cell (e.g., in the memory cell 600 described below) to store, for example, an information via at least two remanent polarization states into which the at least one remanent-polarizable structure 104 can be selectively switched. The writing of the capacitive structure 100 (illustratively the storage of information therein) may be carried out by providing an electric field between the first electrode 102 and the second electrode 106 (e.g., an electric potential difference between a first node and a second node associated with the first electrode 102 and the second electrode 106, respectively, as described in relation to FIG. 6) to thereby set or change the remanent polarization state of the at least one remanent-polarizable structure 104.

It is understood that a remanent-polarizable structure 104 is only an example of a possible functional layer of the capacitive structure 100, and any other functional layer whose state may be altered by an electric field provided across the capacitive structure 100 may be used in the same way.

In general, a remanent polarization (also referred to as retentivity or remanence) may be present in a material layer in the case that the material layer may remain polarized upon reduction of an applied electric field (E) to zero. Therefore, a certain value for the electrical polarization (P) of the material layer may be detected. Illustratively, a polarization remaining in a material, when the electric field is reduced to zero, may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Figure 6:
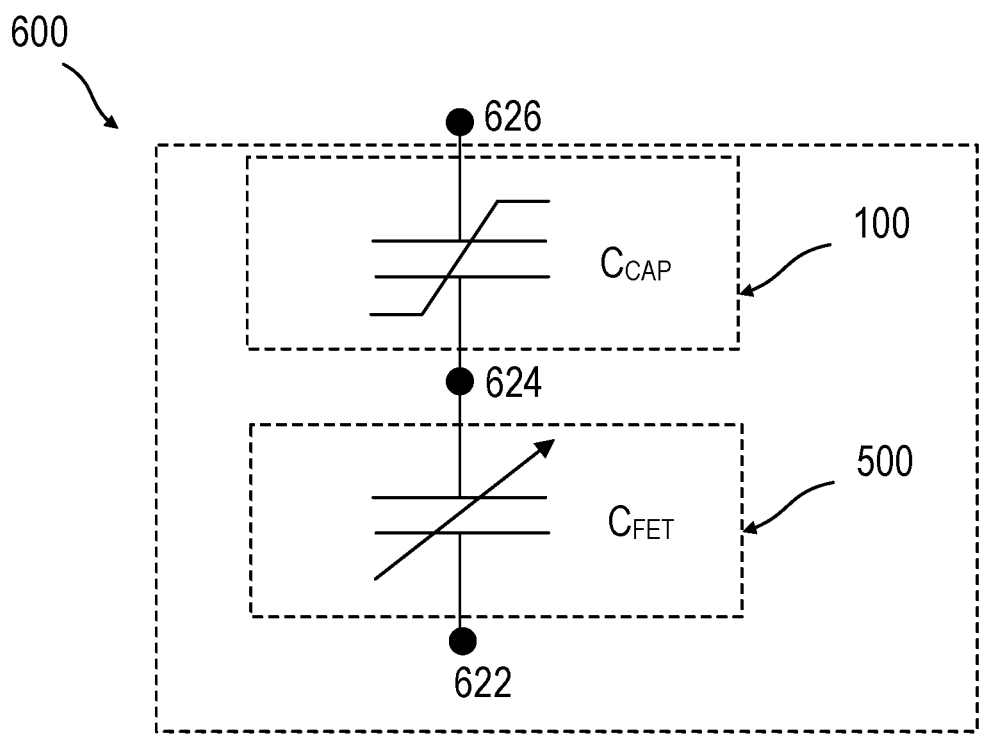
FIG. 6 shows schematically an equivalent circuit diagram of a memory cell, according to various aspects.

According to various aspects, a ferroelectric material may be used as part of a capacitive structure 100 of a memory cell (e.g., as part of the capacitive structure 100 of a memory cell 700a, 700b, 700c, 700d, 700e cf. FIG. 7A-FIG. 7E, or of the capacitive structure 100 of the memory cell 600 cf. FIG. 6). A ferroelectric material may be an example of material of a remanent-polarizable layer 302 (cf. FIG. 3B), e.g., of the remanent-polarizable structure 104. A remanent-polarizable structure 104 by one or more precursor structures 202a, 202b (cf. FIGS. 2A-2F). According to various aspects, ferroelectric materials may be used to store data in a non-volatile manner in integrated circuits.

The ferroelectric material may be or may include ferroelectric $HfO_2$ and/or ferroelectric $ZrO_2$. Ferroelectric $HfO_2$ may include any form of hafnium oxide that may exhibit ferroelectric properties. Ferroelectric $ZrO_2$ may include any form of hafnium oxide that may exhibit ferroelectric properties. A ferroelectric material may include, for example, a solid solution of $HfO_2$ and $ZrO_2$ (e.g. but not limited to a 1:1 mixture) or $HfO_2$ doped, alloyed, or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide. The ferroelectric material may be doped at a concentration from about 2 mol % to about 6 mol %, only as an example.

Ferroelectric $HfO_2$ (FE-HfO) or any other suitable material in its use as non-volatile memory (e.g., for CMOS applications) may show multiple benefits. The single grain structure of the remanent-polarizable structure 104 may enable the formation of a capacitive structure 100 having a low cell-to-cell variability. The material that forms the remanent-polarizable structure 104 or that is included in the remanent-polarizable structure 104 may be in a non-centrosymmetric crystallographic phase (e.g. not in a body centered phase). This way, devices may be easily scaled with dimensions in the order of magnitude of the grain size of the ferroelectric material, e.g., FE-HfO. Hence, the cell-to-cell variability may be improved by reducing or eliminating the grain-to-grain variability of the ferroelectric material, e.g., FE-HfO.

Crystallization of a material, e.g., $HfO_2$, $ZrO_2$, or a mixture thereof, may be influenced by multiple factors. The single grain structure may be achieved by keeping the material in a non-crystalline phase, e.g. an amorphous phase, during the deposition process (e.g., during layering via chemical vapor deposition, physical vapor deposition, e.g., thermal deposition, atomic layer deposition, as examples), during structuring (also referred to as patterning) process of the layer stack. After the structuring process, the material may be encapsulated with a dielectric structure, e.g. a stressliner, and subsequently crystallized by use of a sufficient thermal treatment as described in more detail below (cf. FIG. 3A to FIG. 3F).

The capacitive structure 100 may further include a dielectric structure 108 being in physical contact with and at least laterally surrounding the remanent-polarizable structure 104, as illustrated in FIG. 1A.

Figure 1B:
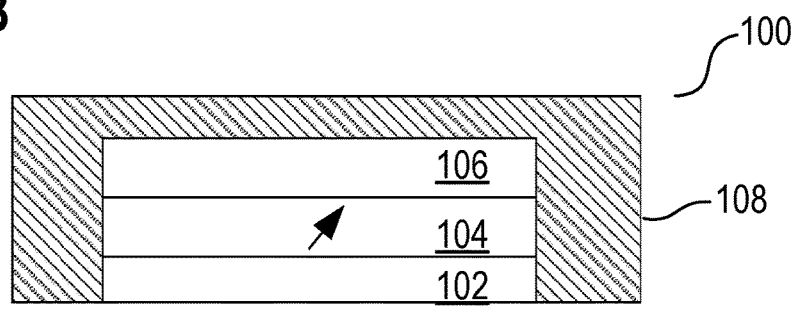

The dielectric structure 108 may be formed over (e.g., directly on) the second electrode 106. The dielectric structure 108 may encapsulate the first electrode 102, the second electrode 106, and the at least one remanent-polarizable structure 104, as illustrated in FIG. 1B. In some aspects, the dielectric structure 108 may encapsulate at least the remanent-polarizable structure 104, e.g., the sidewalls of the remanent-polarizable structure 104, e.g., all surfaces of the remanent-polarizable structure 104 that are not already covered by the first electrode 102 and the second electrode 106.

The capacitive structure 100 may include a plurality of capacitive sub-structures (e.g. capacitors) 100-1, 100-2, 100-n (with n being an integer equal to or greater than 1) that form together the capacitance of the capacitive structure 100. In some aspects, there may be at least a first remanent-polarizable structure 104 and a second remanent-polarizable structure 104 disposed between the first electrode 102 and the second electrode 106. In other aspects, a plurality of capacitive sub-structures 100-1, 100-2, 100-n may be formed (e.g., laterally next to one another) and a first of the capacitive sub-structures 100-1, 100-2, 100-n may include at least a first remanent-polarizable structure 104 and a second of the capacitive sub-structures 100-1, 100-2, 100-n may include a second remanent-polarizable structure 104 disposed between a first electrode 102 and a second electrode 106 respectively. Each of the first and second remanent-polarizable structures 104 may have a single grain structure, respectively (illustrated in FIG. 1C by the arrows). The single grain structure for each of the first and second remanent-polarizable structures 104 may be achieved by keeping their volume comparatively small before the crystallization process is carried out.

A spacing may be formed between the first remanent-polarizable structure 104 and the second remanent-polarizable structure 104. In some aspects, the dielectric structure 108 may be in direct physical contact with and laterally surrounding the first and second remanent-polarizable structures 104. The dielectric structure 108 may be formed in the spacing between the first and second remanent-polarizable structures 104. In other words, structures illustrated in FIG. 1A or FIG. 1B may be formed adjacent on a common substrate 110 and, thus, form a plurality of remanent-polarizable structures 104.

Figure 1C:
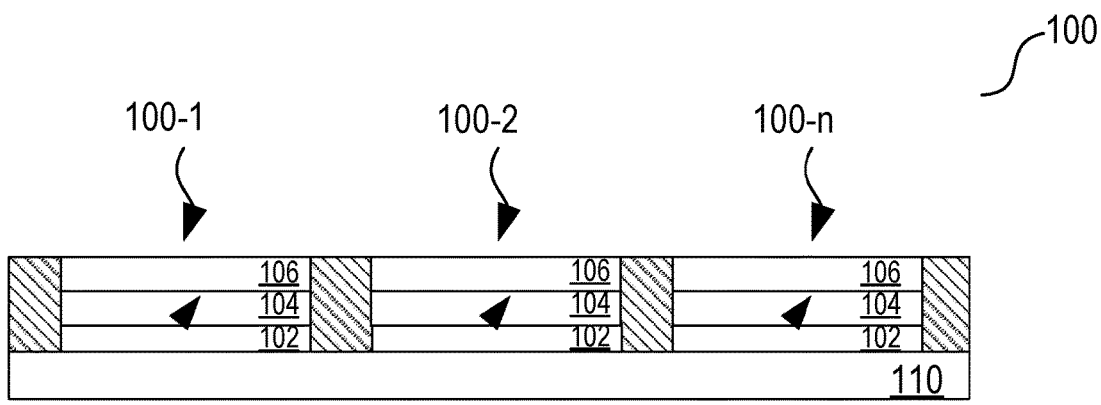
Figure 1D:
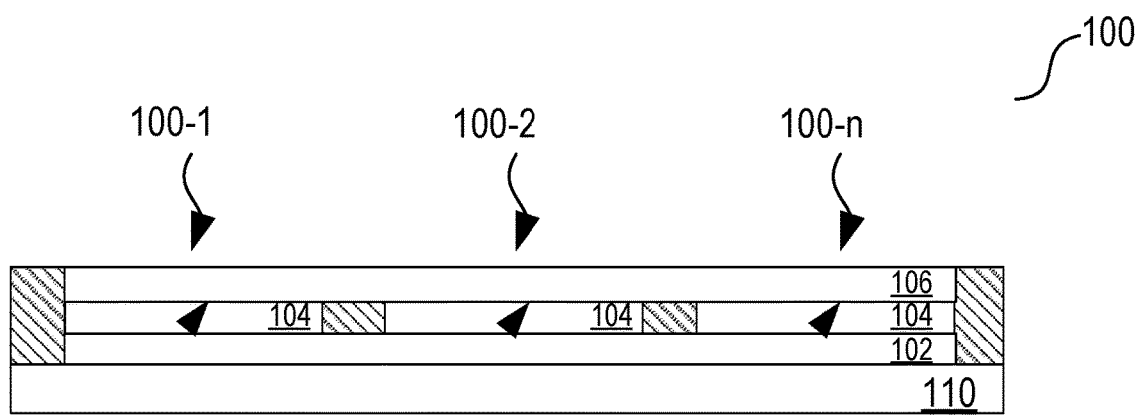
Figure 1E:
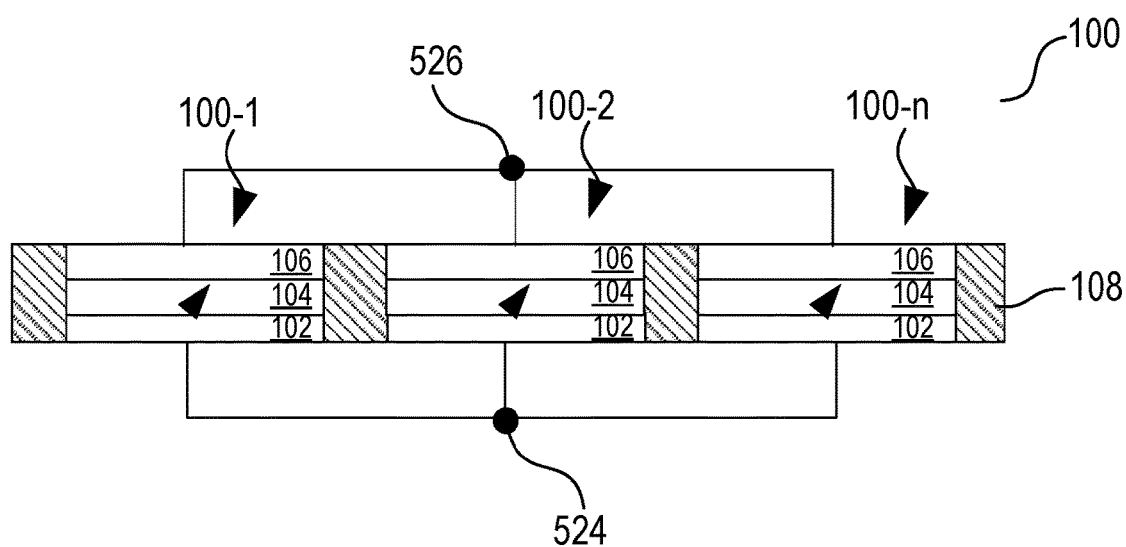
Figure 2A:
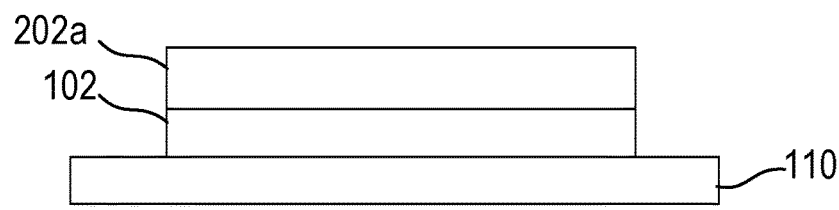
FIG. 2A to FIG. 2F show cross-sections of a schematically flow diagram of a method for forming capacitive structure using precursor structures, according to various aspects.
Figure 2B:
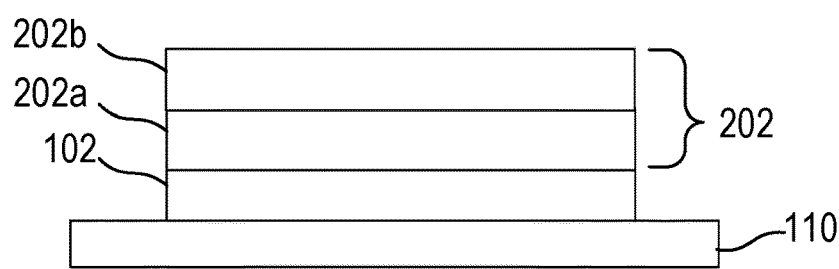
Figure 2C:
Figure 2D:
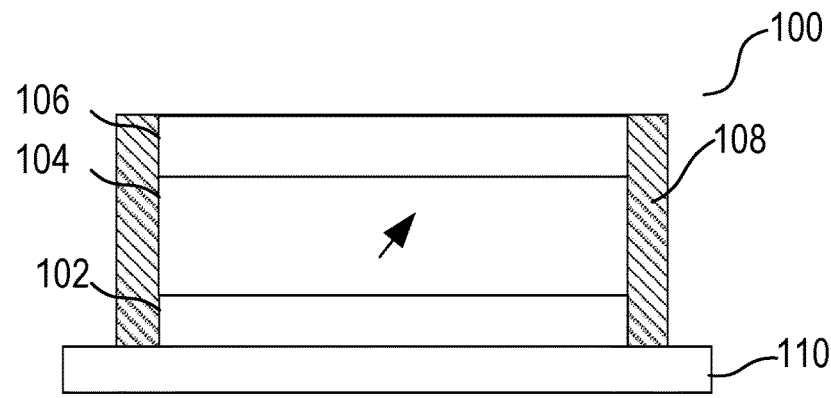
Figure 2E:
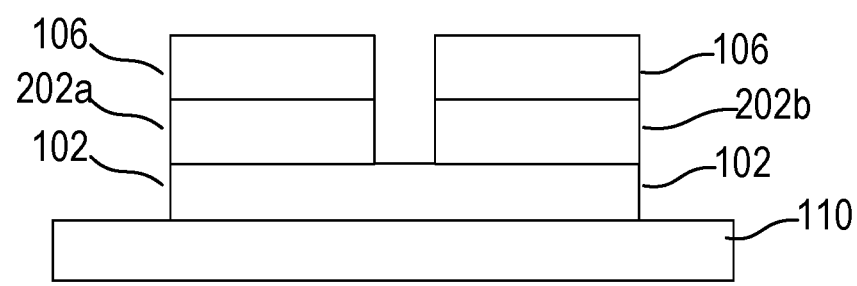
Figure 2F:
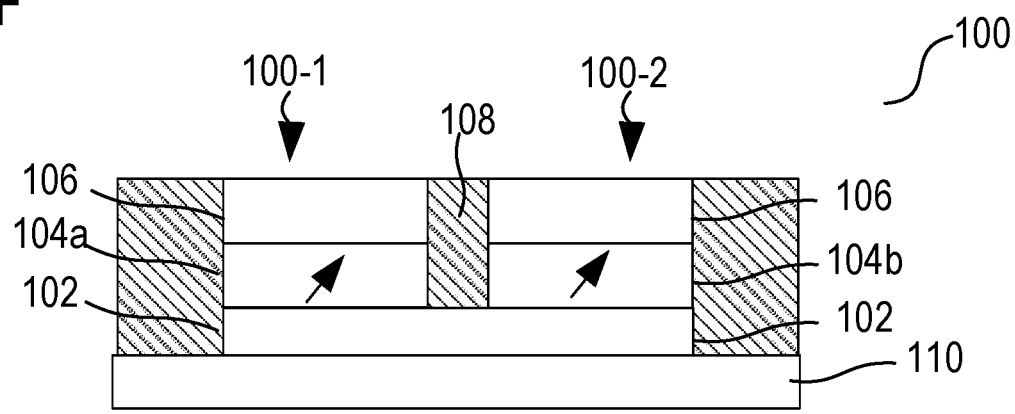

In various aspects, the first remanent-polarizable structure 104 and the second remanent-polarizable structure 104 may be electrically coupled to a common electrode, e.g. a common node 524, 526, as illustrated in FIG. 1D, FIG. 1E and FIG. 2F. The common electrode may be one of the first and second electrodes 102, 106 or connected to one of the first and second electrodes 102, 106. A plurality of remanent-polarizable structures 104 may be arranged in a grid structure, e.g. on or above a common substrate 110, e.g. to commonly form a single capacitive structure (cf. FIG. 1E). The capacitance of the capacitive structure 100 may be increased by increasing the number of remanent-polarizable structures 104 having common electrodes or nodes. In addition, this way, potential non-ferroelectric capacitor structures may be avoided.

FIG. 2A to FIG. 2F illustrate schematic cross-sectional views of a method of forming a capacitive structure using one or more precursor structures according to various aspects by showing different processing stages. The capacitive structure to be formed by the illustrated method may be an aspect according to the memory cell or captive memory structure describe with reference to FIG. 1A to FIG. 1C.

In the aspects illustrated in FIG. 2A to FIG. 2F, the one or more remanent-polarizable structures 104, 104a, 104b are formed by one or more precursor structures 202, 202a, 202b and a crystallization process (see, for example, FIG. 2D, FIG. 2F).

The method may include forming one or more capacitive structures 100. Each of the one or more capacitive structures 100 may include one or more electrodes 102, 106, one or more precursor structures 202, 202a, 202b disposed adjacent to the one or more electrodes 102, 106, wherein each of the one or more precursor structures 202, 202a, 202b may have a first dimension in a range from about 1 nm to 100 nm and a second dimension in a range from about 1 nm to about 30 nm. The method may further include, e.g. subsequently, forming one or more remanent-polarizable structures 104 that may include a crystalline remanent-polarizable material based on a crystallization of a precursor material of the one or more precursor structures 202, 202a, 202b. The precursor material may include a non-remanent-polarizable material. Alternatively, the precursor material may include a remanent-polarizable material that may be different (e.g., different in the crystallinity and/or different in the crystal structure) from the crystalline remanent-polarizable material. The crystallization may be initiated by at least one thermal treatment. The crystalline remanent-polarizable structure 104 may have a single grain structure.

Before the crystallization of the precursor material is triggered, a dielectric structure 108 (also referred to as cover layer or cover structure) may be formed (see, for example, FIG. 2C). The dielectric structure 108 may contact and may at least partially surround the one or more precursor structures 202, 202a, 202b. It is noted that the dielectric structure 108 may at least cover the sidewalls of the one or more precursor structures 202, 202a, 202b, as shown exemplarily in FIG. 2C and FIG. 2D. However, the dielectric structure 108 may contact and may partially or completely cover additionally a second electrode 106, e.g., disposed over the one or more precursor structures 202, 202a, 202b.

In various aspects, forming the one or more capacitive structures 100 may include: forming a layer stack, the layer stack may include one or more electrode layers and a precursor layer disposed adjacent to the one or more electrode layers, structuring the layer stack to form the one or more precursor structures 202 from the precursor layer. The precursor layer may include at least one material that is, at least subsequent to the crystallization process, remanently polarizable.

Structuring the layer stack may include forming one or more capacitors, each of the one or more capacitors may include one or more electrodes 102, 106 formed from the one or more electrode layers, and each of the one or more capacitors may include a respective precursor structure 202 of the one or more precursor structures 202. Each of the one or more capacitors may include a first electrode 102 and a second electrode 106, wherein the respective precursor structure 202 may be disposed between the first electrode 102 and the second electrode 106, and wherein a dielectric structure 108 at least partially encapsulates the respective precursor structure 202, the first electrode 102 and the second electrode 106.

In various aspects, the one or more precursor structures 202 may include at least two precursor structures 202. Structuring the layer stack may include forming a capacitor, the capacitor may include the first electrode 102, the second electrode 106, and the at least two precursor structures 202 disposed between the first electrode 102 and the second electrode 106.

In various aspects, the one or more precursor structures 202 may include a first precursor structure 202a and a second precursor structure 202b. The first precursor structure 202a and the second precursor structure 202b may be stacked on each other (cf FIG. 2A to FIG. 2C) and may together form a remanent-polarizable structure 104 (cf FIG. 2D).

Alternatively, the first precursor structure 202a and the second precursor structure 202b may be formed adjacent to each other on a common substrate, e.g. a common first electrode 102 (cf. FIG. 2E). A spacing may be provided between the first precursor structure 202a and the second precursor structure 202b. A dielectric structure 108 may be formed in the spacing. Thus, the one or more remanent-polarizable structures 104 may include a first remanent-polarizable structure 104a and a second remanent-polarizable structure 104b, wherein a spacing may be provided between the first remanent-polarizable structure 104a and the second remanent-polarizable structure 104b (cf. FIG. 2F).

A lateral extension of each of the one or more precursor structures 202 may be equal to or greater than a thickness of the respective precursor structure 202. A maximal volume of each of the one or more precursor structures 202 may be equal to or less than 0.0003 μm$^3$.

In various aspects, the method of forming one or more remanent-polarizable capacitive structures 100 may include: forming one or more capacitive structures 100, each of the one or more capacitive structures 100 may include one or more electrodes 102, 106 and one or more precursor structures 202 adjacent to the one or more electrodes 102, 106; forming a cover layer over the one or more capacitive structures 100, the cover layer covering at least one surface of the one or more precursor structures 202; and, subsequent to forming the cover layer, forming one or more remanent-polarizable structures 104 adjacent to the one or more electrodes 102, 106 based on a crystallization of a precursor material of the one or more precursor structures 202. The one or more remanent-polarizable structures 104 may include a crystalline remanent-polarizable material.

The cover layer may be or may include a dielectric structure 108 as described. According to various aspects, the cover layer may be or may include a stress liner. The cover layer may include or may be formed from any one of silicon carbide (SiC), silicon oxide (SiOx), silicon nitride (SiN) or silicon oxynitride (SiON). The cover layer may be formed having a layer thickness in a range from about 1 nm to about 30 nm. The cover layer may formed by plasma enhanced atomic layer deposition (PE-ALD) or any other suitably layering process. The cover layer may act as a stress liner and/or stress spacer. As example, the cover layer may include a layer stack of one or more layers of SiOx, SiN and/or SiON.

In various aspects, the method of forming a remanent-polarizable capacitive structure, may include: forming a first electrode 102; forming one or more first precursor structures 202a over the first electrode 102; forming one or more first remanent-polarizable structures 104a may include a crystalline remanent-polarizable material based on a crystallization of a first precursor material of the one or more first precursor structures 202a; subsequently, forming one or more second precursor structures 202b over the one or more first remanent-polarizable structures 104a; forming one or more second remanent-polarizable structures 104b may include a crystalline remanent-polarizable material based on a crystallization of a second precursor material of the one or more second precursor structures 202b; and forming a second electrode 106 over the one or more second remanent-polarizable structures 104b.

In various aspects, the one or more first precursor structures 202a may be disposed adjacent to (e.g., in direct physical contact with), wherein the one or more second precursor structures 202b may be disposed adjacent to (e.g., in direct physical contact with) the second electrode 106. In various aspects, each of the one or more first and/or second precursor structures 202a, b may have a first dimension in a range from about 1 nm to 100 nm and a second dimension in a range from about 1 nm to about 30 nm.

While the capacitive structure illustrated in FIG. 2F has a common first electrode 102 and separated second electrodes 106, in other aspects, the first electrodes 102 may be physically separated (cf. FIG. 1C to FIG. 1E) and/or the second electrodes 106 may be a common second electrode 106 (cf. FIG. 1C to FIG. 1E).

FIG. 3A to FIG. 3F illustrate schematic cross-sectional views of a method of forming a capacitive structure according to various aspects by showing different processing stages. The capacitive structure to be formed by the illustrated method may be an aspect according to the memory cell or captive memory structure describe with reference to FIG. 1A to FIG. 1C.

In the aspects illustrated in FIG. 3A to FIG. 3F, the one or more remanent-polarizable structures 104 are formed by structuring a remanent-polarizable layer 302 and a subsequent crystallization process.

Figure 3A:
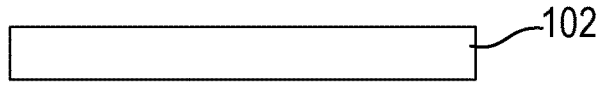
FIG. 3A to FIG. 3F show cross-sections of a schematically flow diagram of a method for forming capacitive structure, according to various aspects.

The method may include to provide or to form a first electrode 102 (see, for example, FIG. 3A). The first electrode 102 may be a bottom or top electrode of the capacitive structure 100 to be formed (see, for example, FIG. 1A-FIG. 1C and FIG. 3F). The first electrode 102 may be formed on a substrate (not illustrated). The substrate may include a field effect transistor as described in more detail below. The first electrode 102 may be formed in an amorphous or crystalline state. The first electrode 102 may be formed having a thickness in a range from about 1 nm to about 30 nm. The first electrode 102 may include or may consist of a metal, e.g., a noble metal, a transition metal, only as examples.

The first electrode 102 may be structured (also referred to as patterned) before the remanent-polarizable layer is formed. Further, the first electrode 102 may be cleaned, the surface energy may be tuned, and/or the surface treated as it may be beneficial for the further processing. Alternatively or in addition, one or more crystallization seed(s) may be formed on the surface of the first electrode 102.

Figure 3B:
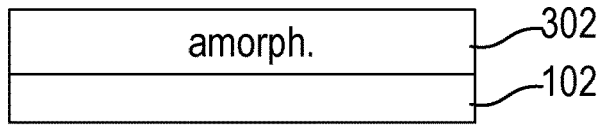

The method may further include forming at least one remanent-polarizable layer 302 over (e.g., directly on) the first electrode 102 (FIG. 3B). The at least one remanent-polarizable layer 302 may include at least one ferroelectric material. As example, the at least one remanent-polarizable layer 302 may be or may include ferroelectric $HfO_2$ ferroelectric $ZrO_2$, or a mixture of ferroelectric $HfO_2/ZrO_2$. According to various aspects, the remanent-polarizable layer 302 is formed in an amorphous state. The remanent-polarizable layer 302 may remain in the amorphous state until the remanent-polarizable layer 302 is structured to have a predetermined dimension in thickness and lateral extension. In various aspects, the remanent-polarizable layer 302 may be formed to have a thickness in in the range from about 2 nm to about 50 nm.

According to various aspects, the thickness of the remanent-polarizable layer 302 may be adjusted by forming a multilayer structure, e.g. a stack of a predefined number of sub-layers that together form the remanent-polarizable layer 302. In one aspect, a sub-layer is crystallized before another sub-layer is added on top of the sub-layer formed before.

The ferroelectric material forming the remanent-polarizable layer 302 may be an example of material for the remanent-polarizable layer 302. The ferroelectric material may be or may include ferroelectric $HfO_2$. Ferroelectric $HfO_2$ may include any form of hafnium oxide that may exhibit ferroelectric properties. This may include, for example, $HfO_2$, a solid solution of $HfO_2$ and $ZrO_2$ (e.g. but not limited to it a 1:1 mixture), or $HfO_2$ or $ZrO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide.

Further, the remanent-polarizable layer 302 may be formed on a seed layer. In some aspects, the first electrode 102 may include a seed layer or may act as the seed layer. In some aspects, the seed layer may be formed over (e.g., directly on) the first electrode 102. The seed layer may promote the formation of the remanent-polarizable layer 302. According to various aspects, the first electrode 102 or the seed layer may be configured to induce single crystalline growth and/or epitaxial crystallization in the remanent-polarizable layer 302.

Figure 3C:
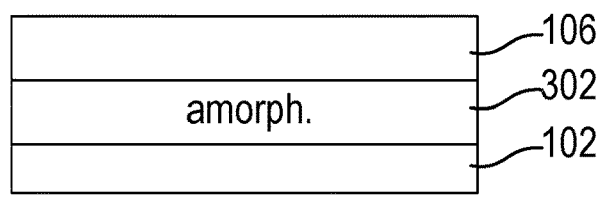

The method may further include forming a second electrode 106 over (e.g., directly on) the remanent-polarizable layer 302 (FIG. 3C). The second electrode 106 may be formed in an amorphous or crystalline state. The second electrode 106 may be formed to have a thickness in a range from about 1 nm to about 30 nm. The second electrode 106 may include or may consist of a metal, e.g., a noble metal, e.g., a transition metal, only as examples.

Figure 3D:
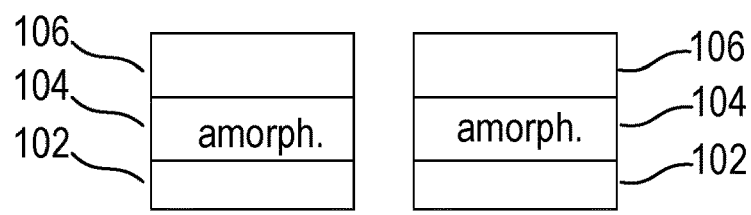

The method may further include structuring at least the at least one remanent-polarizable layer 302 to form at least one remanent-polarizable structure (see FIG. 3D). In addition, the first and/or second electrodes 102, 106 may be structured during the structuring process of the remanent-polarizable layer 302. Thus, the first and/or second electrodes 102, 106 may have a structure corresponding to the structure of the one or more remanent-polarizable structure(s). In some aspects, the first and/or second electrodes 102, 106 may have the same lateral dimension (width) as the one or more remanent-polarizable structure(s)

According to various aspects, the remanent-polarizable layer 302 may be structured such that one or more remanent-polarizable structures are formed each of having a lateral extension in a range from about 1 nm to about 100 nm and a thickness in a range from about 1 nm to about 30 nm. In other words, a single remanent-polarizable structure may have a lateral extension in a range from about 1 nm to about 100 nm and may have a thickness in a range from about 1 nm to about 30 nm. The lateral extension of the at least one remanent-polarizable structure may be equal to or greater than the thickness of the at least one remanent-polarizable structure. The remanent-polarizable structure may have an aspect ratio (lateral extension of at least one lateral side vs. thickness) in a range from about 1 to about 5, e.g. in a range from about 1 to about 3, e.g. between 1 and 3.

The specific dimension of the remanent-polarizable structure may be a function of the specific remanent-polarizable material used to form the remanent-polarizable layer 302, e.g. the doping concentration of the specific remanent-polarizable material, and/or the designated crystalline phase of the single grain remanent-polarizable structure, e.g. face centered cubic structure vs. hexagonal structure.

The structuring of the remanent-polarizable layer 302 prior to the crystallization of the material of the remanent-polarizable structure may enable to form one or more remanent-polarizable structures each having a single grain structure. In other words, a monocrystalline remanent-polarizable structure that is substantially free of amorphous regions and, thus, having a single grain structure may be formed during a crystallization process by choosing the dimensions for the remanent-polarizable structure in the above range (see FIG. 4).

Further, a plurality of remanent-polarizable structures on or above a common substrate may be formed by the structuring process, e.g. at least a first remanent-polarizable structure and a second remanent-polarizable structure (as illustrated in FIG. 3D). A spacing may be formed between the first remanent-polarizable structure and the second remanent-polarizable structure. As mentioned above, the first and second remanent-polarizable structures may be amorphous to this point. The spacing may be in a range between 10 nm and 100 nm, e.g. in a range between 20 nm and 50 nm.

Figure 3E:
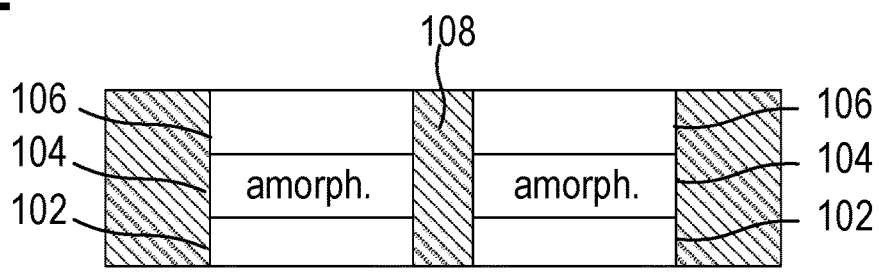

The method may further include forming a dielectric structure 108 in physical contact with and at least laterally surrounding the remanent-polarizable structure (FIG. 3E). The dielectric structure 108 may include or may be formed from any one of silicon carbide (SiC), silicon oxide (SiOx), silicon nitride (SiN) or silicon oxynitride (SiON). The dielectric structure 108 may be formed having a layer thickness in a range from about 1 nm to about 30 nm. The dielectric structure 108 may formed by plasma enhanced atomic layer deposition (PE-ALD) or any other suitably layering process. The dielectric structure 108 may act as a stress liner and/or stress spacer. As example, the dielectric structure 108 may include a layer stack of one or more layers of SiOx, SiN and/or SiON. This way, the dielectric structure 108 may be used for stress engineering, e.g. for tensile or compressive stress adjustment, e.g. in comparison to an interface between air and the material of the remanent-polarizable structure, e.g. during the crystallization process. The dielectric structure 108 may be formed before the remanent-polarizable layer 302 is crystallized. The dielectric structure 108 may form a confinement or boundary for the remanent-polarizable structure during the crystallization process. The dielectric structure 108 may promote the formation of the single grain structure of the remanent-polarizable structure during the crystallization process. The dielectric structure 108 may be further formed on the second electrode 106 and may encapsulate or enclose the first and second electrodes 102, 106 and the at least one remanent-polarizable structure.

In an aspect having two or more remanent-polarizable structures 104, the dielectric structure 108 may be formed in physical contact with and at least laterally surround with the two or more remanent-polarizable structures, e.g. the first and second remanent-polarizable structures. The dielectric structure 108 may also be formed in the spacing between adjacent remanent-polarizable structures, e.g. between the first and second remanent-polarizable structures and in physical contact with both. In various aspects, there may be formed a region in the spacing between the first and second remanent-polarizable structures in which the dielectric structure 108 is formed directly in physical contact with the first electrode 102 and/or the substrate (or carrier carrying the first electrode 102).

Figure 3F:
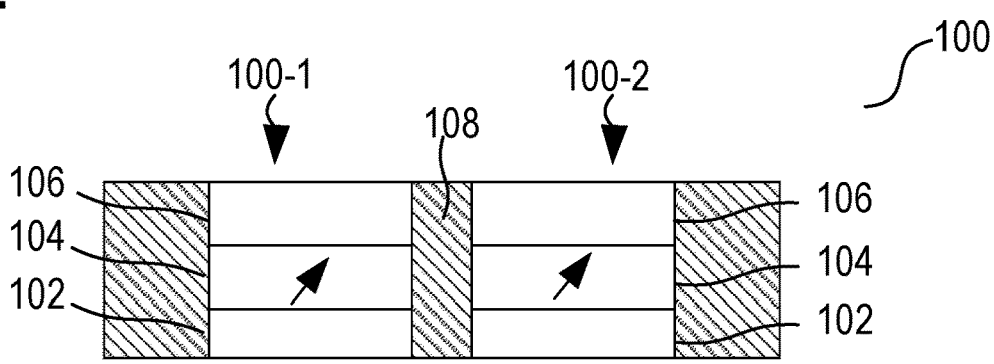

The method may further include crystallizing at least the at least one remanent-polarizable structure (the resulting single grain and monocrystalline state is illustrated by the arrow in FIG. 3F). The crystallization treatment may be a dedicated anneal, e.g. in a temperature range from about 350° C. to 1050° C. The crystallization treatment may be carried out in an inert or reactive anneal ambient. Depending on the crystallographic state and materials of the first and second electrodes 102, 106 before the crystallization process, the first and/or second electrodes 102, 106 may be in an amorphous or crystalline state after the crystallization process.

In further aspects, and as described in more detail below, a forming of a memory cell may further include forming a field-effect transistor structure that may include a gate electrode. The gate electrode may be electrically conductively connected to the first or second electrode 102, 106 of the capacitive structure 100. The field-effect transistor structure may be at least partially embedded in the substrate on which the first electrode is formed. Alternatively, a field-effect transistor structure may be formed on or over the second electrode of the capacitive structure or adjacent to the capacitive structure.

A memory cell arrangement may include a plurality of memory cells distributed over a wafer. Each memory cell of the plurality of memory cells may include: a remanent-polarizable capacitive structure 100 that may include a first electrode 102, a second electrode 106, and one or more remanent-polarizable structures 104 disposed between the first electrode 102 and the second electrode 106, each of the one or more remanent-polarizable structures 104 may include a remanent-polarizable material having a single grain structure with a crystallographic orientation; wherein, for all memory cell of the plurality of memory cells, the crystallographic orientations of the single grain structures may be aligned into the same direction.

In various aspects, the one or more remanent-polarizable structures 104 may include at least two remanent-polarizable structures 104. A spacing may be formed between respectively neighboring portions of the at least two remanent-polarizable structures 104. All of the one or more remanent-polarizable structures 104 may be electrically coupled to a common electrode, wherein the common electrode may be one of the first electrode 102 and the second electrode 106 or wherein the common electrode may be connected to one of the first electrode 102 and the second electrode 106.

In various aspects, a method of forming one or more memory cells may include forming one or more field-effect transistor structures, each of the one or more field-effect transistor structures may include a gate electrode; and forming one or more remanent-polarizable capacitive structures 100 as described above. A respective gate electrode of each of the one or more field-effect transistor structures may be coupled to at least one corresponding remanent-polarizable capacitive structure 100 of the one or more remanent-polarizable capacitive structures 100.

In various aspects, the method of forming one or more memory cells may include: forming one or more field-effect transistor structures, each of the one or more field-effect transistor structures may include a gate electrode; and forming one or more remanent-polarizable capacitive structures 100 as described; wherein a respective gate electrode of each of the one or more field-effect transistor structures may be coupled to at least one corresponding remanent-polarizable capacitive structure 100 of the one or more remanent-polarizable capacitive structures 100.

In various aspects, the method for forming a memory cell may include: forming a field-effect transistor structure may include a gate electrode; forming a first electrode 102 layer, a second electrode 106 layer, and a precursor layer 202 disposed between the first electrode 102 layer and the second electrode 106 layer, wherein the precursor layer 202 may include a precursor material that allows for a formation of a crystalline remanent-polarizable material therefrom, and wherein the gate electrode may be electrically conductively connected to the first electrode 102 layer; structuring at least the second electrode 106 layer and the remanent-polarizable layer 302 to form a plurality of capacitors, each capacitor of the plurality of capacitors may include one or more precursor structures 202 formed from the precursor layer 202; subsequent to the structuring of at least the second electrode 106 layer and the precursor layer 202, forming a cover layer over the plurality of capacitors, the cover layer covering at least one surface of the one or more precursor structures 202; and, subsequent to the formation of the cover layer, crystallizing the precursor material of the one or more precursor structures 202 to form one or more remanent-polarizable structures 104.

In various aspects, the method for forming a memory cell may include: forming a field-effect transistor structure may include a gate electrode; forming a first electrode 102 layer, a second electrode 106 layer, and a precursor layer 202 disposed between the first electrode 102 layer and the second electrode 106 layer, wherein the precursor layer 202 may include a precursor material that allows for a formation of a crystalline ferroelectric material therefrom, and wherein the gate electrode may be electrically conductively connected to the first electrode 102 layer; structuring at least the second electrode 106 layer and the precursor layer 202 to form a plurality of capacitors, each capacitor of the plurality of capacitors may include one or more precursor structures 202 formed from the precursor layer 202; subsequent to the structuring of at least the second electrode 106 layer and the precursor layer 202, forming a cover layer over the plurality of capacitors, the cover layer covering at least one surface of the one or more precursor structures 202; and, subsequent to the formation of the cover layer, crystallizing the precursor material of the one or more precursor structure 202 of the plurality of capacitors.

Figure 4:
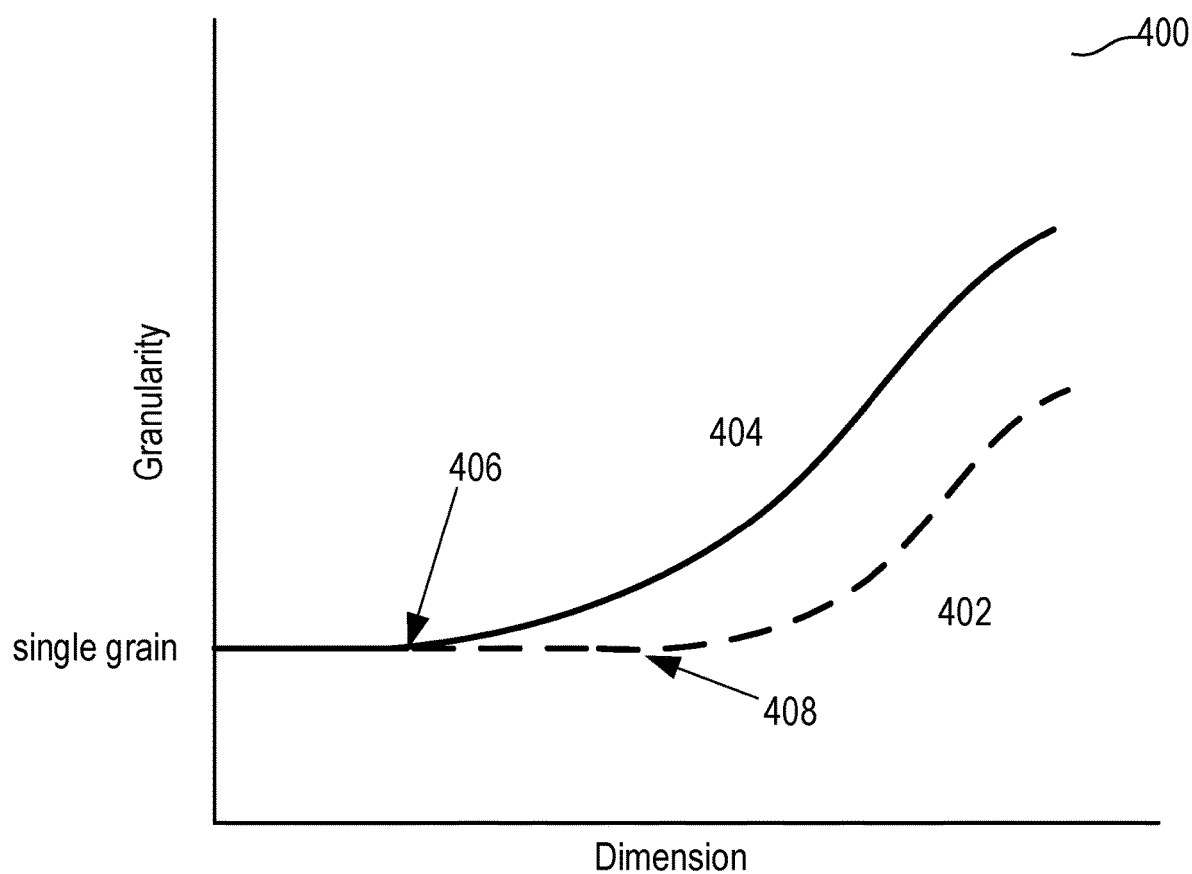
FIG. 4 shows a diagram regarding the dimension of a remanent-polarizable structure according to various aspects.

FIG. 4 illustrates in a diagram 400 the functional relationship between the lateral extension 402 and thickness 404 of the remanent-polarizable structure 104 regarding the crystallinity of the remanent-polarizable structure 104. It can be seen, that within a range of thickness 404 and lateral extension 402 (below threshold values 406, 408) a single grain remanent-polarizable structure 104 may be formed. However, beyond the threshold values 406, 408 a remanent-polarizable structure having amorphous region(s) and/or polycrystalline region(s) would be formed. The threshold values 406, 408 may depend on the material composition of the remanent-polarizable structure 104 and/or presence and thickness of the dielectric structure. However, single grain remanent-polarizable structures 104 may be achieved by reducing the structural size or dimension of the remanent-polarizable structure. Two or more remanent-polarizable structures 104 (e.g. a plurality of remanent-polarizable structures 104) may be formed, used and/or connected to one or more common electrodes 102, 106 to provide a capacitive structure having a predetermined capacitance or minimum threshold capacitance. Alternatively, two or more capacitive structure may be formed on or above a common substrate by the structuring process to form two or more capacitive structures 100 on a common substrate.

Figure 5:
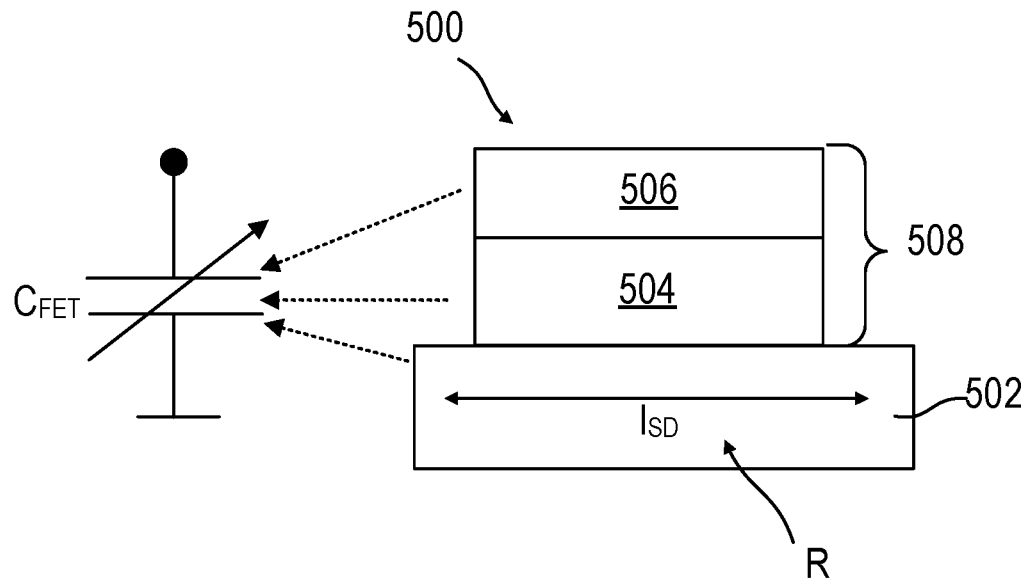
FIG. 5 shows schematically a field-effect transistor structure, according to various aspects.

FIG. 5 shows a schematic functioning of a field-effect transistor structure 500, according to various aspects. The field-effect transistor structure 500 may include a gate structure 508, wherein the gate structure 508 may include a gate isolation 504 and a gate electrode 506. The gate structure 508 is illustrated exemplarily as a planar gate stack, however, it may be understood that the planar configuration shown in FIG. 4 is an example, and other field-effect transistor designs may include a gate structure 508 with a non-planar shape, for example a trench gate transistor design, a vertical field-effect transistor design, or other designs as exemplarily shown in FIG. 6D and FIG. 6E, as examples. The gate structure 508 may define a channel region 502, e.g., provided in a semiconductor portion (e.g., in a semiconductor layer, in a semiconductor die, etc.). The gate structure 508 may allow for a control an electrical behavior of the channel region 502. The gate structure 508 may, for example, be used to control (e.g., allow or prevent) a current flow in the channel region 502. In other words, the gate structure 508 may, for example, allow to control (e.g., allow or prevent) a source/drain current, $I_{SD}$, from a first source/drain region of the field-effect transistor structure 500 to a second source/drain region of the field-effect transistor structure 500 (the source/drains are provided in or adjacent to the channel but are not shown in FIG. 4). In some aspects, the gate structure 508 may control (e.g., increase or reduce) an electrical resistance, R, of the channel region 502 and, accordingly, control the amount of current that may flow through the channel region 502. With respect to the operation of the field-effect transistor structure 500, a voltage (illustratively an electrical potential) may be provided at (e.g., supplied to) the gate electrode 506 to control the current flow, $I_{SD}$, in the channel region 502, the current flow, $I_{SD}$, in the channel region 502 being caused by voltages supplied via the source/drain regions.

The gate electrode 506 may include an electrically conductive material, for example, polysilicon, aluminum, etc. However, the gate electrode 506 may include any other suitable electrically conductive material, e.g., a metal, a metal alloy, a degenerate semiconductor (in other words a semiconductor material having such a high level of doping that the material acts like a metal and not anymore as a semiconductor). According to various aspects, the gate electrode 506 may include one or more electrically conductive portions, layers, etc. The gate electrode 506 may include, for example, one or more metal layers (also referred to as a metal gate), one or more polysilicon layers (also referred to as poly-Si-gate), etc. A metal gate may include, for example, at least one work-function adaption metal layer disposed over the gate isolation 504 and an additional metal layer disposed over the work-function adaption metal layer. A poly-Si-gate may be, for example, p-type or n-type doped.

According to various aspects, the gate isolation 504 may be configured to provide an electrical separation of the gate electrode 506 from the channel region and further to influence the channel region via an electric field generated by the gate electrode 506. The gate isolation 504 may include one or more electrically insulating portions, layers, etc.

As illustrated by the circuit equivalent in FIG. 4, the channel region 502, the gate isolation 504, and the gate electrode 506 may have a capacitance, $C_{FET}$, associated therewith, originating from the more or less conductive regions (the channel region 502 and the gate electrode 506) separated from one another by the gate isolation 504. Illustratively, the channel region 502 may be considered as a first capacitor electrode, the gate electrode 506 as a second capacitor electrode, and the gate isolation 504 as a dielectric medium between the two capacitor electrodes. The capacitance, $C_{FET}$, of the field-effect transistor structure 500 may define one or more operating properties of the field-effect transistor structure 500. The configuration of the field-effect transistor structure 500 (e.g., of the gate isolation 504) may be adapted according to a desired behavior or application of the field-effect transistor structure 500 during operation (e.g., according to a desired capacitance), as described in further detail below.

FIG. 6 shows a circuit equivalent of a memory cell 600 including a field-effect transistor structure 500 (e.g., configured as described here with reference to the memory transistor 500 illustrated in FIG. 5) and a capacitive structure 100, according to various aspects, e.g. as described above. The field-effect transistor (FET) structure 500 may have a first capacitance, $C_{FET}$, associated therewith and the capacitive structure 100 may have a second capacitance, $C_{CAP}$, associated therewith.

The field-effect transistor structure 500 and the capacitive structure 100 may be coupled (e.g., electrically connected) to one another such that a capacitive voltage divider is provided. The channel or bulk node of the field-effect transistor structure 500 may provide or may be connected to a first node 622, an electrode of the capacitive structure 100 may provide or may be connected to a second node 626 and an intermediate conductive portion (electrode, layer, etc.) may provide or may be connected to a floating intermediate node 624. Exemplary realizations of such connected structures will be described in further detail below, for example in relation to FIG. 7A to FIG. 7E.

The capacitive voltage divider formed by the field-effect transistor structure 500 and the capacitive structure 100 may allow adapting the capacitances $C_{FET}$, $C_{CAP}$ of the respective capacitors to allow an efficient programming of the capacitive structure 100. The overall gate voltage required for switching the memory cell 600 from one memory state into another memory state (e.g. from high threshold voltage state to low threshold voltage state, as described below), may become smaller in case the voltage distribution across the field-effect transistor structure 500 and the capacitive structure 100 is adapted such that more of the applied gate voltage drops across the functional layer of the capacitive structure 100 (e.g., across the remanent-polarizable layer 302, such as a ferroelectric layer) than across the gate isolation of the field-effect transistor structure 500. The overall write voltage (illustratively, applied via the nodes 622, 626 to which the field-effect transistor structure 500 and the capacitive structure 100 are connected) may thus be reduced by adapting the capacitive voltage divider. The voltage distribution may be determined by voltage divider calculations for a series connection of the capacitors.

That is, in case the capacitance, $C_{FET}$, of the field-effect transistor structure 500 is increased (e.g., by providing a suitable gate isolation, as described above) and/or the capacitance, $C_{CAP}$, of the capacitive structure 100 is decreased a higher fraction of the voltage applied to the series connection drops across the capacitive structure 100. Accordingly, the electric field generated across the gate isolation of the field-effect transistor structure 500 underneath the capacitive structure 100 reduces because the voltage drop across this region is reduced.

This leads to a reduced interfacial field stress, which may lead to a reduced wear out of the interface due to, for example, charge injection. Therefore, the reduced electric field generated across the gate isolation may lead to improved endurance characteristics of the memory cell 600, that is, to an increased amount of possible polarization reversals until the memory cell 600 may lose its memory properties.

According to various aspects, a memory cell (e.g., a memory cell 100, 600, 700a, 700b, 700c, 700d, 700e), may have at least two distinct memory states associated therewith, for example represented by two distinct electrical conductivities or two distinct amounts of stored charge that may be determined to determine in which of the at least two distinct states the memory cell is residing in. According to various aspects, a memory state the memory cell is residing may be a "programmed state" or an "erased state". As an example, the programmed state may be an electrically conducting state or a state with positive stored charge (e.g. associated with a logic "1") and the erased state may be an electrically non conducting state or a state with negative stored charge (e.g., associated with a logic "0"). However, the definition of programmed state and erased state may be selected arbitrarily. According to various aspects, the residual polarization of the remanent-polarizable layer 302 may define the memory state a memory cell is residing in. The polarization state of the remanent-polarizable layer 302 may be switched by means of the capacitive structure. The polarization state of the remanent-polarizable layer 302 may also be read out by means of the capacitive structure. According to various aspects, a memory cell may reside in a first memory state in the case that the remanent-polarizable layer 302 is in a first polarization state, and the memory cell may reside in a second memory state in the case that the remanent-polarizable layer 302 is in a second polarization state (e.g., opposite to the first polarization state). As an example, the polarization state of the remanent-polarizable layer 302 may determine the amount of charge stored in the capacitive structure. The amount of charge stored in the capacitive structure may be used to define a memory state of the memory cell. The threshold voltage of a field-effect transistor structure in a memory cell may be a function of the amount and/or polarity of charge stored in the capacitive structure, e.g. on the polarization state of the remanent-polarizable layer 302. A first threshold voltage, e.g. a high threshold voltage $V_{H-th}$, may be associated with the first polarization state (e.g., with the first amount and/or polarity of stored charge), and a second threshold voltage, e.g. a low threshold voltage $V_{L-th}$, may be associated with the second polarization state (e.g., with the second amount and/or polarity of stored charge). Illustratively, the first memory state may be associated with the first threshold voltage, and the second memory state may be associated with the second threshold voltage.

In some aspects, the functional layer of the capacitive structure 100 may be a remanent-polarizable layer 302. By increasing the capacitance $C_{FET}$ of the field-effect transistor structure 500 (e.g., by providing a gate isolation including a relatively thick layer of material with high dielectric constant), the depolarization field, $E_{Dep}$, of the remanent-polarizable layer 302 may be reduced. The depolarization field may be expressed by the following set of equations, wherein the indices "FET" refer to the capacitor provided by the field-effect transistor structure 500 and the indices "CAP" refer to the capacitor provided by the capacitive structure 100, as described herein:

$$V_{FET} + V_{CAP} = 0,$$

$$D = \varepsilon_0 \varepsilon_{FET} E_{FET} = \varepsilon_0 \varepsilon_{CAP} E_{CAP} + P,$$

$$E_{CAP} \equiv E_{Dep} = -P\left(\varepsilon_0 \varepsilon_{CAP}\left(\frac{C_{FET}}{C_{CAP}} + 1\right)\right)^{-1}.$$

The depolarization field $E_{Dep}$ may be detrimental to data retention since, depending on its magnitude, it may depolarize the remanent-polarizable layer 302. However, the magnitude may be reduced by increasing the capacitance ratio $C_{FET}/C_{CAP}$. Accordingly, in case the capacitance $C_{FET}$ of the field-effect transistor structure 500 is increased, the depolarization field is reduced. This in turn improves the data retention of the memory cell 600.

In a first approximation, the voltage which drops across the memory structure capacitor ($V_{CAP}$) may be estimated by:

$$V_{CAP} = V_{626} \cdot \frac{C_{FET}}{C_{FET} + C_{CAP}},$$

wherein $V_{626}$ represents the voltage applied to the top node 626 (e.g., to a top electrode of the capacitive structure 100, for example assuming that the node 622 associated with the bulk of the field-effect transistor structure 500 is connected to a base potential, e.g. to ground or 0 V) and the capacitances in general are defined as described above. Suitable parameters for influencing the voltage drop across the capacitive structure 100 (e.g., across the ferroelectric capacitor) may be represented by the area ratio between the capacitive structure 100 and the field-effect transistor structure 500, and/or by the relative permittivity of the field-effect transistor structure 500 (e.g., of the gate isolation of the field-effect transistor structure 500).

In some aspects, an improved performance of the memory cell 600 may be provided in case about 75% of the applied voltage drops across the capacitive structure 100 (and about 25% across the field-effect transistor structure 500). This may be provided, for example, in case the field-effect transistor structure 500 has a capacitor area three times greater than a capacitor area of the capacitive structure 100, as described by the following equation, $$V_{CAP} = V_{626} \cdot \frac{C_{FET}}{C_{FET} + C_{CAP}} \stackrel{3 \cdot A_{CAP} = A_{FET}}{=} V_{626} \cdot \frac{3}{4} = 0.75 \cdot V_{626}.$$

However, adjusting the voltage distribution by providing a field-effect transistor structure 500 with a large capacitor area may prevent an application of the memory cell 600 at small technology nodes (e.g., at the 28 nm technology node). The adjustment of the voltage distribution in the voltage divider provided by adapting the dielectric constant (and the thickness) of the gate isolation of the field-effect transistor structure 500 (e.g., of a second gate isolation layer thereof), as described above, may allow providing a smaller footprint for the memory cell 600.

In some aspects, the gate isolation of the field-effect transistor structure 500 may be configured such that a ratio of the (first) capacitance $C_{FET}$ of the field-effect transistor structure 500 to the (second) capacitance $C_{CAP}$ of the capacitive structure 100 may be in the range from about 1 to about 16, for example the ratio of the first capacitance $C_{FET}$ to the second capacitance $C_{CAP}$ may be 4. In some aspects, the capacitive structure 100 (the entire area or summarized area of all the remanent-polarizable structures of one capacitive structure) may have the same capacitor area as the field-effect transistor structure 500, so that the ratio of the first capacitance $C_{FET}$ of the field-effect transistor structure 500 to the second capacitance $C_{CAP}$ of the capacitive structure 100 may be adapted.

Increasing the capacitance $C_{FET}$ of the field-effect transistor structure 500 to adjust the gate voltage divider may allow keeping the thickness of the functional layer (e.g., the remanent-polarizable layer 302) of the capacitive structure 100 in an optimal range. By way of example, changing a ferroelectric film thickness may affect the ferroelectric properties of a ferroelectric layer. Therefore, being able to change the gate stack voltage divider without changing the film thickness of a ferroelectric layer as the memory layer may allow implementing a memory cell 600 with optimal performance.

FIG. 7A to FIG. 7E illustrate schematically possible realizations of a respective memory cell 700a, 700b, 700c, 700d, 700e. These memory cells 700a, 700b, 700c, 700d, 700e may be configured such that a field-effect transistor structure 500 and a capacitive structure 100 of the respective memory cell 700a, 700b, 700c, 700d, 700e are connected to form a capacitive voltage divider $C_{FET}/C_{CAP}$, as described with reference to the memory cell 600 in FIG. 6.

Each of the described memory cells 700a, 700b, 700c, 700d, 700e may include a field-effect transistor structure 500 including a channel 502, a gate isolation 504, and a gate electrode 506, the channel 502 and the gate electrode 506 may be configured as described above.

Each of the described memory cells 700a, 700b, 700c, 700d, 700e may include a capacitive structure 100 electrically connected (in other words, electrically coupled) with the field-effect transistor structure 500. The capacitive structure 702b may include any type of planar or non-planar design with at least a first electrode 102, a second electrode 106 and at least one remanent-polarizable structure 104 disposed between the first electrode 102 and the second electrode 106, e.g. to provide memory functions.

Figure 7A:
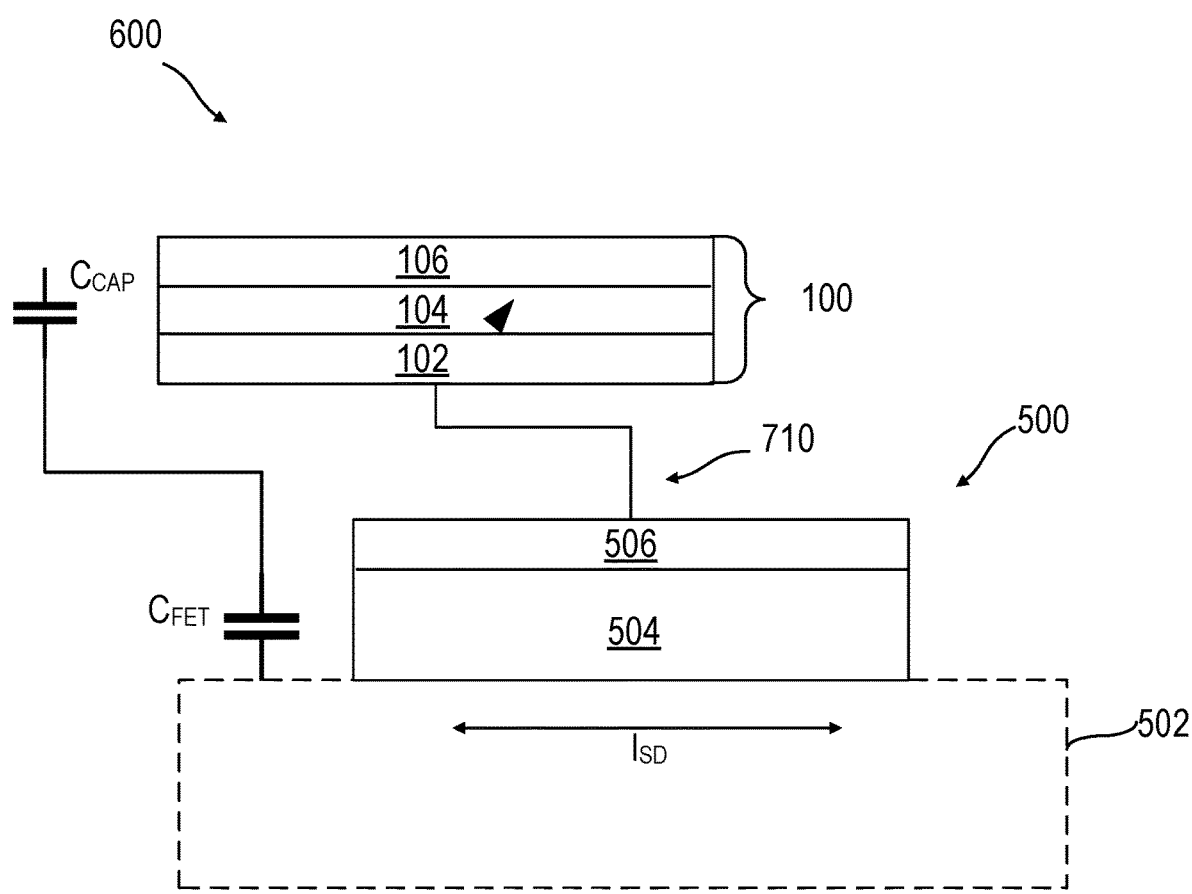
FIG. 7A to FIG. 7E each shows schematically a memory cell, according to various aspects.

As described above with reference to the memory cell 600 in FIG. 6, the field-effect transistor structure 500 and the capacitive structure 100 may be connected to form a capacitive voltage divider $C_{FET}/C_{CAP}$, e.g., by connecting one of the electrodes of the capacitive structure 100 (e.g., the first electrode 102) with the gate electrode 506 of the field-effect transistor structure 500, as shown for example in FIG. 7A. The electrically conductive connection of the capacitive structure 100 with the field-effect transistor structure 500 (e.g., of the first electrode 102 with the gate electrode 506) may provide a series capacitive connection between the capacitors formed by the capacitive structure 100 and the field-effect transistor structure 500. In a planar configuration, the first electrode 102 of the capacitive structure 100 may be a first capacitor electrode 102, the second electrode 106 may be a second capacitor electrode 106, and the at least one remanent-polarizable structure 104 may be a dielectric medium 104 between the first electrode 102 and the second electrode 106.

In some aspects, the gate electrode 506 of the field-effect transistor structure 500 may be electrically conductively connected to the first electrode 102 of the capacitive structure 100 via an electrically conductive (e.g., ohmic) connection 710, as shown in FIG. 7A. In some aspects, the first electrode 102 of the capacitive structure 100 may be in direct physical contact with the gate electrode 506 of the field-effect transistor structure 500.

Figure 7B:
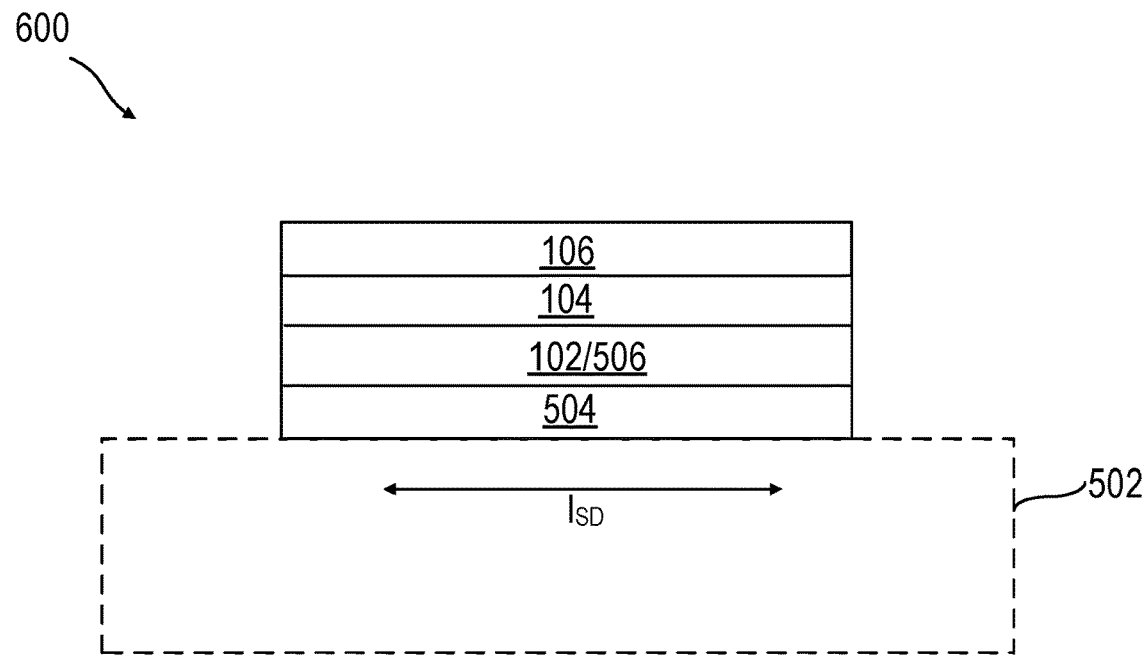

In some aspects, the capacitive structure 100 and the field-effect transistor structure 500 may share a common electrode acting as gate electrode of the field-effect transistor structure 500 and electrode of the capacitive structure 100, as shown in FIG. 7B.

Figure 7C:
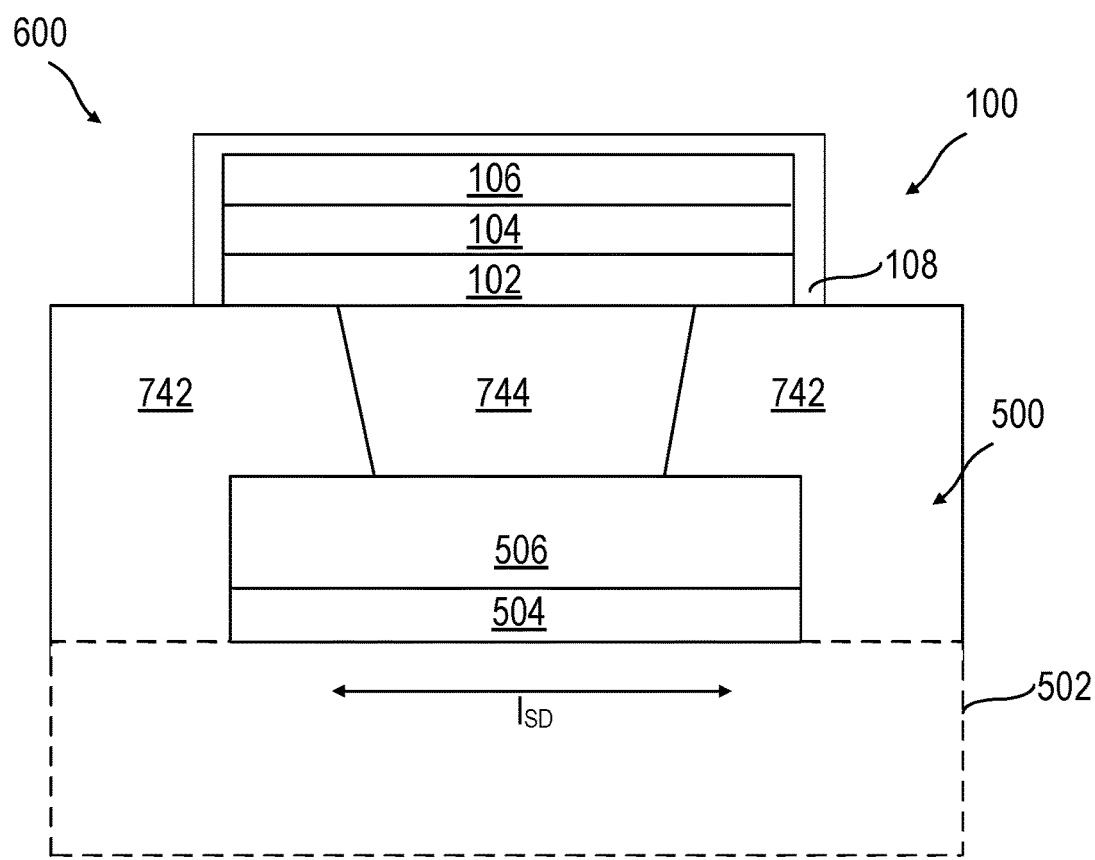

In some aspects, the electrically conductive (e.g., ohmic) connection 710 between the field-effect transistor structure 500 and the capacitive structure 100 may be provided by one or more metallization structures disposed over the field-effect transistor structure 500, as shown in FIG. 7C.

According to various aspects, the semiconductor portion, may be made of or may include silicon. However, other semiconductor materials of various types may be used in a similar way, e.g. germanium, Group III to V (e.g. SiC), or other types, including for example carbon nanotubes, organic materials (e.g., organic polymers), etc. In various aspects, the semiconductor portion may be a wafer made of silicon (e.g. p-type doped or n-type doped). In other aspects, the semiconductor portion may be a silicon on insulator (SOI) wafer. In other aspects, the semiconductor portion may be provided by a semiconductor structure, e.g., by one or more semiconductor fins, one or more semiconductor nanosheets, one or more semiconductor nanowires, etc., disposed at a carrier.

FIG. 7C shows an exemplary integration scheme for a memory cell 700c in a schematic view, according to various aspects, in which a metallization structure is provided to electrically connect the field-effect transistor structure 500 to the capacitive structure 100. It is understood that the metallization structure may include a plurality of metallization structures, e.g. a plurality of single- or multi-level contact structures.

The metallization structure may be configured to electrically conductively connect the gate electrode 506 of the field-effect transistor structure 500 to the first electrode 102 of the capacitive structure 100. As an example, the metallization structure may include a contact metallization. The contact metallization may be at least partially disposed between the field-effect transistor structure 500 and the capacitive structure 100. As another example, the metallization structure may include a contact metallization and a single- or multilevel metallization disposed over the contact metallization. In this case, both the contact metallization and at least one level of the single- or multilevel metallization may be disposed between the field-effect transistor structure 500 and the capacitive structure 100.

In some aspects, the metallization structure may be disposed over an active area of the field-effect transistor structure 500, and the capacitive structure 100 may be disposed over the metallization structure. By arranging the capacitive structure 100 (e.g., as ferroelectric capacitor) above the field-effect transistor structure 500 the full scaling potential may be maintained.

The metallization structure may include a gate contact structure 744 (also referred to as gate contact). The gate contact structure 744 may be embedded in (e.g., may be laterally surrounded by) an insulator layer 742. The insulator layer 742 may include a dielectric material, e.g., silicon oxide ($SiO_2$), silicon nitride ($SiN_x$), etc., having, for example, a thickness in the range from about 10 nm to about 100 nm, e.g., a thickness of 40 nm. The gate contact structure 744 may include at least one metal layer, e.g., including tungsten (W), cobalt (Co), etc. The gate contact structure 744 may be in direct physical contact with the gate electrode 506 of the field-effect transistor structure 500. The gate contact structure 744 may be in direct physical contact with the first electrode 102 of the capacitive structure 100. According to various aspects, the electrical connection between the first electrode 102 of the capacitive structure 100 and the gate electrode 506 of the field-effect transistor structure 500 may be formed by the gate contact structure 744.

A further metallization structure (shown, for example, in FIG. 7D and FIG. 7E) may be formed over the capacitive structure 100. The further metallization structure may include a memory contact structure (also referred to as memory contact). The memory contact structure may be embedded in (e.g., may be laterally surrounded by) a further (e.g., second) insulator layer.

Figure 7D:
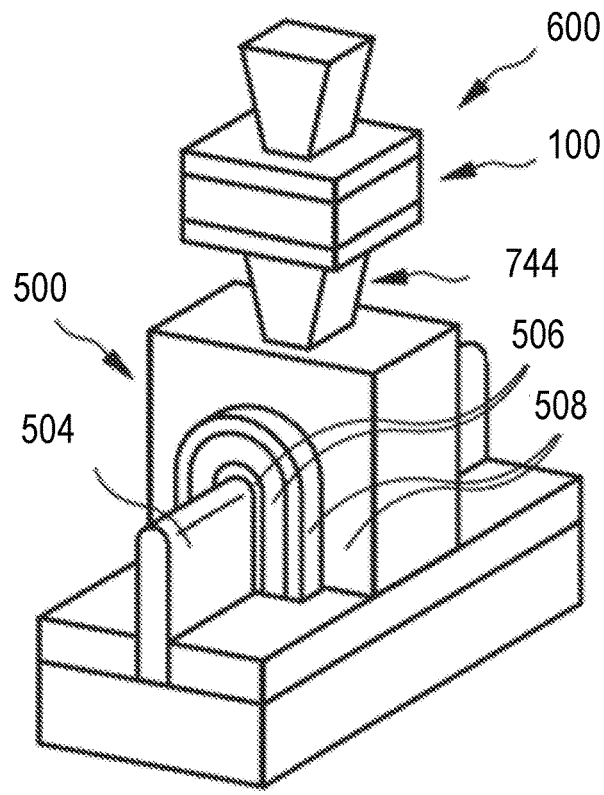
Figure 7E:
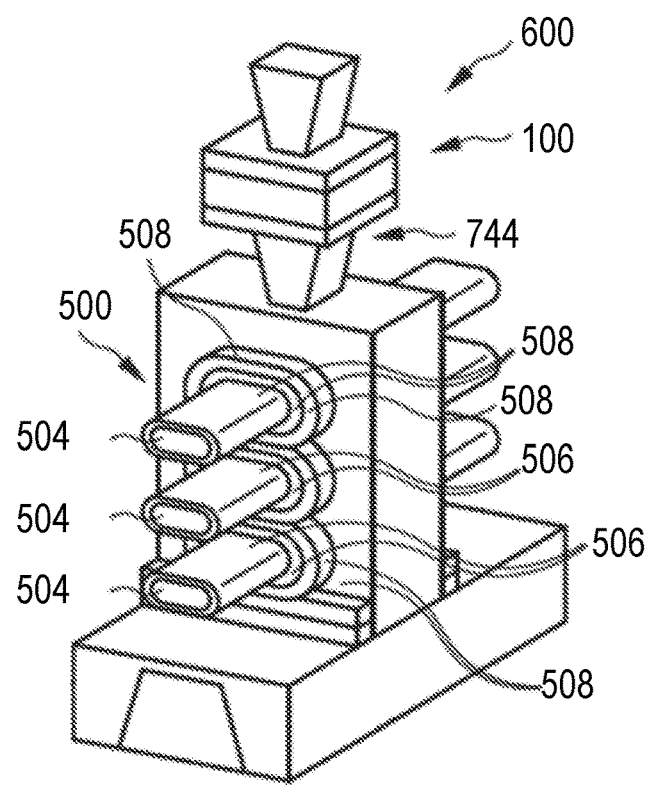

FIG. 7D and FIG. 7E illustrate possible non-planar structures for a memory cell 700d, 700e, e.g. for a field-effect transistor structure 500 (e.g., for a memory transistor described above).

In the integration scheme shown in FIG. 7D, at least the field-effect transistor structure 500 of the memory cell 700d may be configured as a fin field-effect transistor (FinFET). The semiconductor portion 704 in which the channel region is provided may have the shape of a vertical fin, wherein the gate isolation 504 and the gate electrode 506 may at least partially surround the fin.

In the integration scheme shown in FIG. 7E, at least the field-effect transistor structure 500 of the memory cell 700e may be configured as a nanosheet or nanowire field-effect transistor. The one or more semiconductor portions 704, in which a channel region is provided, may each have the shape of a nanosheet or nanowire. The gate isolation 504 and the gate electrode 506 may at least partially surround the respective nanosheets or nanowires.

Figure 8:
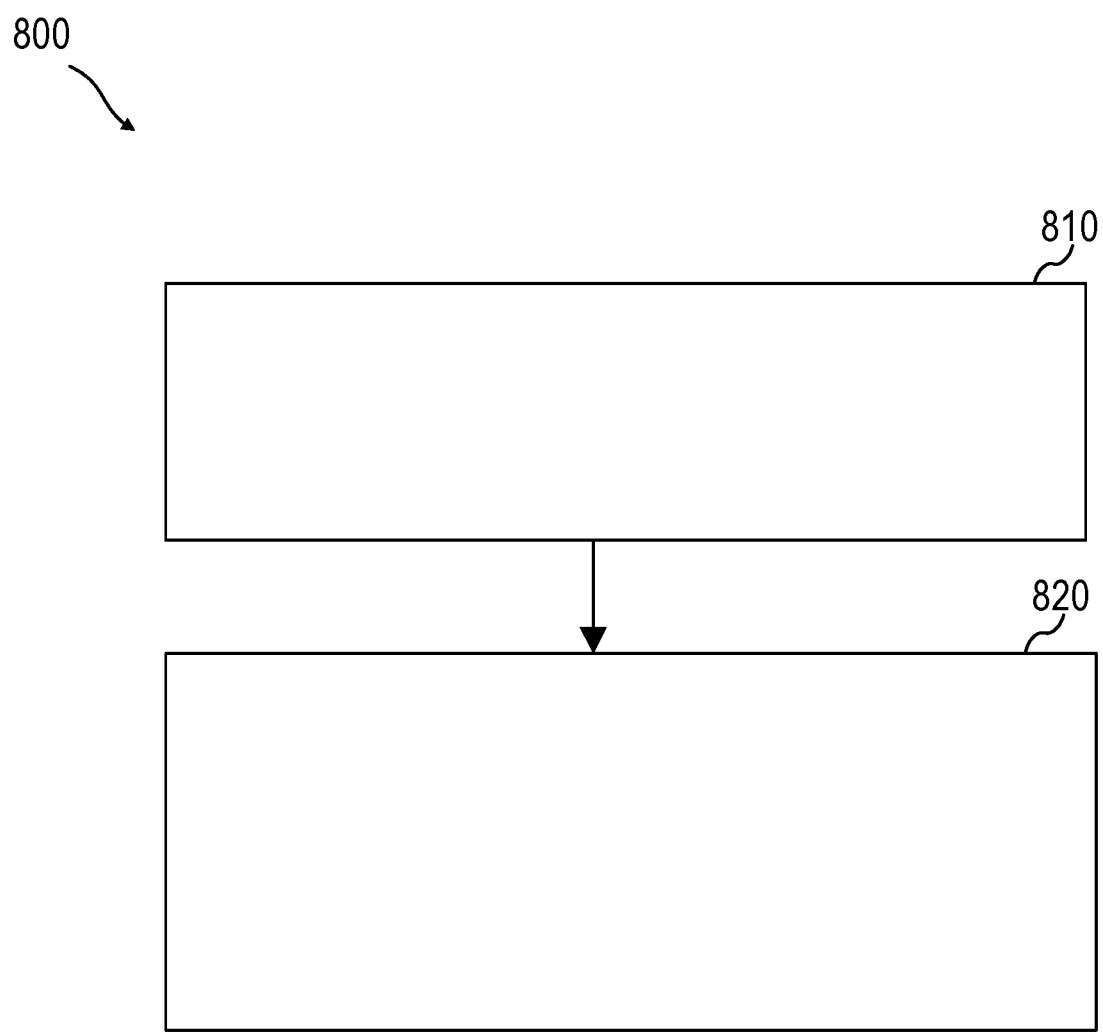
FIG. 8 shows a schematic flow diagram of a method for forming a memory cell, according to various aspects.

FIG. 8 illustrates a schematic flow diagram of a method 800 for forming a memory cell, e.g. for forming the memory cell 600 described in relation to FIG. 8 and/or the memory cell 700a, 700b, 700c, 700d, 700e described in relation to FIG. 7A to FIG. 7E, according to various aspects.

According to various aspects, the method 800 may include: in 810, forming a capacitive structure; and in 820 forming a field-effect transistor structure including a gate isolation and a gate electrode wherein the capacitive structure and the field-effect transistor structure are coupled with one another to form a capacitive voltage divider.

In some aspects, the capacitive structure may include a first electrode, a second electrode, and at least one remanent-polarizable layer 302 disposed between the first electrode and the second electrode. In some aspects, an electrode (e.g., the first electrode) of the capacitive structure may be electrically conductively connected with the gate electrode of the field-effect transistor structure.

In some aspects, the method 800 may include one or more layering and patterning processes for forming the memory cell, e.g. for forming the memory structure and/or the field-effect transistor structure. The patterning may include forming a mask (e.g., a silicon nitride hard mask having a thickness in the range from about 1 nm to about 100 nm) defining the lateral dimension of the field-effect transistor structure, e.g. of a gate structure thereof, and partially removing the gate isolation layer and the gate electrode.

Forming the field-effect transistor structure may include forming doped regions in a carrier, e.g. in a semiconductor substrate or portion, e.g. to form at least two source/drain regions of the field-effect transistor structure. Various doping techniques may be used to form the at least two source/drain regions, e.g. diffusion doping, ion implantation, or the like. Forming the field-effect transistor structure may include layering and patterning a gate structure at a (channel) region between the doped regions forming the at least two source/drain regions.

The layering may include forming a first electrode layer (e.g., a bottom electrode layer), a second electrode layer (e.g., a top electrode layer), and at least one remanent-polarizable layer 302 disposed between the two electrode layers. The patterning may include forming a mask (e.g., a silicon nitride hard mask having a thickness in the range from about 1 nm to about 100 nm) defining the lateral dimension of the capacitive structure and partially removing the electrode layers and the at least one remanent-polarizable layer 302 to form the capacitive structure. The capacitive structure may be formed over a metallization structure (illustratively the contact metallization) including a gate contact structure.

According to various aspects, the gate contact structure may be formed by depositing an insulator material (for example $SiO_2$ or SiN) across the whole carrier and by forming a contact hole above the gate structure for each field-effect transistor structure of the memory cell (e.g., by one or more lithography processes and wet or dry chemical etching). The contact hole may be either directly be formed above the gate structure, i.e. above the active area, or, if this is not possible (e.g. because of design rules), then the contacting of the gate structure may be done with an offset to the active area.

According to various aspects, one or more patterning processes may be used to form a field-effect transistor structure and/or a capacitive structure, e.g., at least one of over or in a carrier. Therefore, a mask may be used. A mask may include a material that serves for transferring a photolithography mask pattern into one or more material layers. A mask may include, for example, a positive or negative photo resist (also referred to as soft mask) or a hard mask. The photo resist itself may be patterned by standard lithography processes. The patterning of the hard mask material may include a combination of photo resist patterning followed by etch of the hard mask material (e.g. wet or dry chemical etching). However, any other suitable process may be used to transfer a desired pattern into one or more material layers.

According to various aspects, a memory cell as described herein may be integrated in an electronic device (e.g., e.g., a microcontroller, a central processing unit, a system on a chip (SoC), a memory device), for example in a same electronic device with other components, such as components to control logic operations and/or input/output operations of the electronic device. Illustratively, one or more memory transistors may be integrated (and formed) on or in a same carrier as one or more logic transistors and/or one or more input/output transistors.

The processing (e.g., the fabrication) of a memory transistor may be integrated in a process flow for processing an electronic device. Illustratively, the processing of a memory transistor may be carried out in parallel with the processing of logic transistors and/or I/O transistors used in an electronic device, e.g. to provide an electronic device with data storage capabilities.

In the following, various aspects of this disclosure will be illustrated.

Example 1 is a method of forming a capacitive structure, the method may include forming a first electrode, a second electrode, and at least one remanent-polarizable layer disposed between the first electrode and the second electrode, structuring at least the at least one remanent-polarizable layer to form at least one remanent-polarizable structure, wherein the remanent-polarizable structure includes a first dimension (e.g., a lateral extension) in a range from about 1 nm to 100 nm and a second dimension (e.g., a thickness or vertical extension) in a range from about 1 nm to 30 nm; and crystallizing at least the at least one remanent-polarizable structure. According to various aspects, the remanent-polarizable structure may include a third dimension (e.g., another lateral extension) in a range from about 1 nm to 100 nm. In some aspects, Example 1 may be a method of forming a capacitive structure, the method may include forming a first electrode, a second electrode, and at least one remanent-polarizable layer disposed between the first electrode and the second electrode, structuring at least the at least one remanent-polarizable layer to form at least one remanent-polarizable structure, wherein the remanent-polarizable structure includes a first dimension (e.g., a lateral extension) less than 100 nm and a second dimension (e.g., a thickness or vertical extension) less than 30 nm; and crystallizing at least the at least one remanent-polarizable structure. According to various aspects, the remanent-polarizable structure may include a third dimension (e.g., another lateral extension) less than 100 nm.

In Example 2, example 1 may optionally further include forming a dielectric structure in physical contact with and at least laterally surrounding the remanent-polarizable structure before the remanent-polarizable structure is crystallized.

In Example 3, example 1 or 2 may optionally include that the dielectric structure is further formed on the second electrode and encapsulates the first and second electrodes and the at least one remanent-polarizable structure.

In Example 4, any one example 1 to 3 may optionally include that at least a first remanent-polarizable structure and a second remanent-polarizable structure are formed, wherein a spacing is formed between the first remanent-polarizable structure and the second remanent-polarizable structure.

In Example 5, example 3 may optionally further include forming a dielectric structure in physical contact with and at least laterally surrounding the first and second remanent-polarizable structures before the remanent-polarizable layer is crystallized, wherein the dielectric structure is also formed in the spacing between the first and second remanent-polarizable structures. In some aspects, the dielectric structure may be or may include a stress layer or may be part of a stress layer. In some aspects, the dielectric structure may be a stress liner or may be part of a stress liner.

In Example 8, any one example 1 to 5 may optionally include that wherein the at least one remanent-polarizable layer includes at least one ferroelectric material.

In Example 7, any one example 1 to 8, may optionally include that the at least one remanent-polarizable layer is or includes ferroelectric $HfO_2$.

In Example 8, any one example 1 to 7 may optionally include that the lateral extension of the at least one remanent-polarizable structure is equal to or greater than the thickness of the at least one remanent-polarizable structure.

Example 9 is a method for processing a memory cell, the method may include forming a capacitive structure may include: forming a first electrode, a second electrode, and at least one remanent-polarizable layer disposed between the first electrode and the second electrode, structuring at least the at least one remanent-polarizable layer to form at least one remanent-polarizable structure, wherein the remanent-polarizable structure includes a lateral extension in a range from about 1 nm to 100 nm and a thickness in a range from about 1 nm to 30 nm; and crystallizing at least the at least one remanent-polarizable structure; and forming a field-effect transistor structure may include a gate electrode, wherein the gate electrode is electrically conductively connected to the first electrode of the capacitive structure.

In Example 10, example 9 may optionally further include that forming a dielectric structure in physical contact with and at least laterally surrounding the remanent-polarizable structure before the remanent-polarizable structure is crystallized.

In Example 11, any one example 9 to 10 may optionally include that the dielectric structure is further formed on the second electrode and encapsulates the first and second electrodes and the at least one remanent-polarizable structure.

In Example 12, any one example 9 to 11 may optionally include that at least a first remanent-polarizable structure and a second remanent-polarizable structure are formed, wherein a spacing is formed between the first remanent-polarizable structure and the second remanent-polarizable structure.

In Example 13, any one example 9 to 12 may optionally include that forming a dielectric structure in physical contact with and at least laterally surrounding the first and second remanent-polarizable structures before the remanent-polarizable layer is crystallized, wherein the dielectric structure is also formed in the spacing between the first and second remanent-polarizable structures.

In Example 14, any one example 9 to 13 may optionally include that the at least one remanent-polarizable layer includes at least one ferroelectric material.

In Example 15, any one example 9 to 12 may optionally include that the at least one remanent-polarizable layer is or includes ferroelectric $HfO_2$.

In Example 16, any one example 9 to 14 may optionally include that the lateral extension of the at least one remanent-polarizable structure is equal to or greater than the thickness of the at least one remanent-polarizable structure.

Example 17 is a memory cell that may include a capacitive structure may include a first electrode, a second electrode, and at least one remanent-polarizable structure disposed between the first electrode and the second electrode, the remanent-polarizable structure having a single grain structure.

In Example 18, example 17 may optionally further include a dielectric structure being in physical contact with and at least laterally surrounding the remanent-polarizable structure.

In Example 19, any one example 17 or 18 may optionally include that the dielectric structure is further formed on the second electrode and encapsulates the first and second electrodes and the at least one remanent-polarizable structure.

In Example 20, any one example 17 to 19 may optionally include that the at least one remanent-polarizable structure includes at least one ferroelectric structure.

In Example 21, any one example 17 to 20 may optionally include that the at least one remanent-polarizable structure is or includes ferroelectric $HfO_2$.

In Example 22, any one example 17 to 21 may optionally include that at least a first remanent-polarizable structure and a second remanent-polarizable structure disposed between the first electrode and the second electrode, each of the first and second remanent-polarizable structures having a single grain structure, wherein a spacing is formed between the first remanent-polarizable structure and the second remanent-polarizable structure.

In Example 23, example 22 may optionally include that the first remanent-polarizable structure and the second remanent-polarizable structure are electrically coupled to a common electrode, wherein the common electrode is one of the first and second electrodes or connected to one of the first and second electrodes.

In Example 24, any one example 17 to 23 may optionally include that a dielectric structure being in physical contact with and laterally surrounding the first and second remanent-polarizable structures, wherein the dielectric structure is formed in the spacing between the first and second remanent-polarizable structures.

In Example 25, any one example 17 to 24 may optionally include that the remanent-polarizable structure includes a lateral extension in a range from about 1 nm to 100 nm and a thickness in a range from about 1 nm to 30 nm In Example 26, any one example 17 to 25 may optionally include that the lateral extension of the at least one remanent-polarizable structure is equal to or greater than the thickness of the at least one remanent-polarizable structure.

In Example 27, any one example 17 to 26 may optionally include a field-effect transistor structure may include a gate electrode, wherein the gate electrode is electrically conductively connected to the first electrode of the capacitive structure.

Example 28 is a memory cell arrangement including a plurality of memory cells distributed over a wafer. Each memory cell of the plurality of memory cells may include a capacitive structure including a first electrode, a second electrode, and a remanent-polarizable material disposed between the first electrode and the second electrode, the remanent-polarizable material having a single grain structure oriented into a respective crystallographic orientation. For all memory cell of the plurality of memory cells the respective crystallographic orientation of the single grain structure is substantially the same.

In Example 29, example 28 may further include a dielectric structure being in physical contact with and at least laterally surrounding the remanent-polarizable structure.

In Example 30, example 29 may include that the dielectric structure is further formed on the second electrode and at least partially encapsulates the first and second electrodes and the at least one remanent-polarizable structure.

In Example 31, any one of examples 28 to 30 may optionally include that the at least one remanent-polarizable structure includes at least one ferroelectric material.

In Example 32, any one of examples 28 to 31 may optionally include at least a first remanent-polarizable structure and a second remanent-polarizable structure disposed between the first electrode and the second electrode, each of the first and second remanent-polarizable structures having a single grain structure. A spacing may be formed between the first remanent-polarizable structure and the second remanent-polarizable structure.

In Example 33, any one of examples 28 to 32 may optionally include that the first remanent-polarizable structure and the second remanent-polarizable structure are electrically coupled to a common electrode, wherein the common electrode is one of the first and second electrodes or connected to one of the first and second electrodes.

In Example 34, any one of examples 28 to 33 may optionally include a dielectric structure being in physical contact with and laterally surrounding the first and second remanent-polarizable structures, wherein the dielectric structure is formed in the spacing between the first and second remanent-polarizable structures.

In Example 35 any one of examples 28 to 34 may optionally include that the remanent-polarizable structure includes a lateral extension in a range from about 1 nm to 100 nm and a thickness in a range from about 1 nm to 30 nm In Example 36, any one of examples 28 to 35 may optionally include that a lateral extension of the at least one remanent-polarizable structure is equal to or greater than a thickness of the at least one remanent-polarizable structure.

In Example 37, any one of examples 28 to 35 may optionally include that a field-effect transistor structure includes a gate electrode, wherein the gate electrode is electrically conductively connected to the first electrode of the capacitive structure.

Example 38 is a method of forming one or more remanent-polarizable capacitive structures. The method may include forming one or more capacitive structures. Each of the one or more capacitive structures may include one or more electrodes, one or more precursor structures disposed adjacent to the one or more electrodes, wherein each of the one or more precursor structures has a first dimension in a range from about 1 nm to 100 nm and a second dimension in a range from about 1 nm to about 30 nm. The method may further include, e.g. subsequently, forming one or more remanent-polarizable structures may include a crystalline remanent-polarizable material based on a crystallization of a precursor material of the one or more precursor structures.

In Example 39, example 38 may optionally include that the precursor material may include a non-remanent-polarizable material, or wherein the precursor material may include a remanent-polarizable material that is different (e.g., different in the crystallinity and/or different in the crystal structure) from the crystalline remanent-polarizable material.

In Example 40, example 38 or 39 may optionally include that the crystallization is initiated by at least one thermal treatment.

In Example 41, any one of examples 38 to 40 may optionally include that the crystalline remanent-polarizable structure has a single grain structure.

In Example 42, any one of examples 38 to 41 may optionally include that before the crystallization of the precursor material, forming a dielectric structure, the dielectric structure contacts and at least partially surrounds the one or more precursor structures.

In Example 43, any one of examples 38 to 42 may optionally include that forming the one or more capacitive structures may include: forming a layer stack, the layer stack may include one or more electrode layers and a precursor layer disposed adjacent to the one or more electrode layers, structuring the layer stack to form the one or more precursor structures from the precursor layer.

In Example 44, example 43 may optionally include that structuring the layer stack may include forming one or more capacitors, each of the one or more capacitors may include one or more electrodes formed from the one or more electrode layers, and each of the one or more capacitors may include a respective precursor structure of the one or more precursor structures.

In Example 45, example 44 may optionally include that each of the one or more capacitors may include a first electrode and a second electrode, wherein the respective precursor structure is disposed between the first electrode and the second electrode, and wherein a dielectric structure at least partially encapsulates the respective precursor structure, the first electrode and the second electrode.

In Example 46, any one of examples 44 to 45 may optionally include that the one or more precursor structures include at least two precursor structures, wherein each of the one or more capacitive structures may include a first electrode and a second electrode, and wherein structuring the layer stack may include forming a capacitor, the capacitor may include the first electrode, the second electrode, and the at least two precursor structures disposed between the first electrode and the second electrode.

In Example 47, any one of examples 38 to 46 may optionally include that the one or more precursor structures include a first precursor structure and a second precursor structure, wherein a spacing is provided between the first precursor structure and the second precursor structure, and/or the one or more remanent-polarizable structures include a first remanent-polarizable structure and a second remanent-polarizable structure, wherein a spacing is provided between the first remanent-polarizable structure and the second remanent-polarizable structure.

In Example 48, example 47 may optionally include that forming a dielectric structure in the spacing between the first precursor structure and the second precursor structure.

In Example 49, any one of examples 43 to 47 may optionally include that the precursor layer may include at least one material that is, at least subsequent to the crystallization process, remanently polarizable.

In Example 50, any one of examples 38 to 49 may optionally include that a lateral extension of each of the one or more precursor structures is equal to or greater than a thickness of the respective precursor structure.

In Example 51, any one of examples 38 to 50 may optionally include that a maximal volume of each of the one or more precursor structures is equal to or less than 0.0003 $\mu m^3$.

Example 52 is a method of forming one or more memory cells. The method may include forming one or more field-effect transistor structures, each of the one or more field-effect transistor structures may include a gate electrode; and forming one or more remanent-polarizable capacitive structures according to any one of examples 38 to 51; wherein a respective gate electrode of each of the one or more field-effect transistor structures is coupled to at least one corresponding remanent-polarizable capacitive structure of the one or more remanent-polarizable capacitive structures.

Example 53 is a method of forming one or more remanent-polarizable capacitive structures, the method may include: forming one or more capacitive structures, each of the one or more capacitive structures may include one or more electrodes and one or more precursor structures adjacent to the one or more electrodes; forming a cover layer over the one or more capacitive structures, the cover layer covering at least one surface of the one or more precursor structures; and, subsequent to forming the cover layer, forming one or more remanent-polarizable structures adjacent to the one or more electrodes based on a crystallization of a precursor material of the one or more precursor structures, the one or more remanent-polarizable structures may include a crystalline remanent-polarizable material. In some aspects, the cover layer may be formed such that the cover layer is in direct physical contact with one or more surfaces of the respective capacitive structure. The cover layer may be formed such that the cover layer is in direct physical contact with a top electrode of the respective capacitive structure. The cover layer may be formed such that the cover layer is in direct physical contact with the precursor material of the one or more precursor structures.

The cover layer may be or may include a dielectric structure as described herein. According to various aspects, the cover layer may be or may include a stress liner. The cover layer may include or may be formed from any one of silicon carbide (SiC), silicon oxide (SiOx), silicon nitride (SiN) or silicon oxynitride (SiON). The cover layer may be formed having a layer thickness in a range from about 1 nm to about 30 nm. The cover layer may formed by plasma enhanced atomic layer deposition (PE-ALD) or any other suitably layering process. The cover layer may act as a stress liner and/or stress spacer. As example, the cover layer may include a layer stack of one or more layers of SiOx, SiN and/or SiON.

Example 54 is a method of forming one or more memory cells, the method may include: forming one or more field-effect transistor structures, each of the one or more field-effect transistor structures may include a gate electrode; and forming one or more remanent-polarizable capacitive structures according to example 53; wherein a respective gate electrode of each of the one or more field-effect transistor structures is coupled to at least one corresponding remanent-polarizable capacitive structure of the one or more remanent-polarizable capacitive structures.

Example 55 is a memory cell arrangement that may include a plurality of memory cells distributed over a wafer. Each memory cell of the plurality of memory cells may include: a remanent-polarizable capacitive structure may include a first electrode, a second electrode, and one or more remanent-polarizable structures disposed between the first electrode and the second electrode, each of the one or more remanent-polarizable structures may include a remanent-polarizable material having a single grain structure with a crystallographic orientation; wherein, for all memory cell of the plurality of memory cells, the crystallographic orientations of the single grain structures are aligned into substantially the same direction. In some aspects, the crystallographic orientations of the single grain structures are aligned along a predefined alignment direction with a deviation of less than ±20°.

In Example 56, example 55 may include that the one or more remanent-polarizable structures may include at least two remanent-polarizable structures. A spacing may be formed between respectively neighboring portions of the at least two remanent-polarizable structures.

In Example 57, example 55 or 56 may optionally include that all of the one or more remanent-polarizable structures are electrically coupled to a common electrode, wherein the common electrode is one of the first electrode and the second electrode or wherein the common electrode is connected to one of the first electrode and the second electrode.

Example 58 is a method for forming a memory cell, the method may include: forming a field-effect transistor structure may include a gate electrode; forming a first electrode layer, a second electrode layer, and a precursor layer disposed between the first electrode layer and the second electrode layer, wherein the precursor layer may include a precursor material that allows for a formation of a crystalline remanent-polarizable material therefrom, and wherein the gate electrode is electrically conductively connected to the first electrode layer; structuring at least the second electrode layer and the remanent-polarizable layer to form a plurality of capacitors, each capacitor of the plurality of capacitors may include one or more precursor structures formed from the precursor layer; subsequent to the structuring of at least the second electrode layer and the precursor layer, forming a cover layer over the plurality of capacitors, the cover layer covering at least one surface of the one or more precursor structures; and, subsequent to the formation of the cover layer, crystallizing the precursor material of the one or more precursor structures to form one or more remanent-polarizable structures.

Example 59 is a method for forming a memory cell, the method may include: forming a field-effect transistor structure may include a gate electrode; forming a first electrode layer, a second electrode layer, and a precursor layer disposed between the first electrode layer and the second electrode layer, wherein the precursor layer may include a precursor material that allows for a formation of a crystalline ferroelectric material therefrom, and wherein the gate electrode is electrically conductively connected to the first electrode layer; structuring at least the second electrode layer and the precursor layer to form a plurality of capacitors, each capacitor of the plurality of capacitors may include one or more precursor structures formed from the precursor layer; subsequent to the structuring of at least the second electrode layer and the precursor layer, forming a cover layer over the plurality of capacitors, the cover layer covering at least one surface of the one or more precursor structures; and, subsequent to the formation of the cover layer, crystallizing the precursor material of the one or more precursor structure of the plurality of capacitors.

Example 60 is a method of forming a remanent-polarizable capacitive structure, the method may include: forming a first electrode; forming one or more first precursor structures over the first electrode; forming one or more first remanent-polarizable structures may include a crystalline remanent-polarizable material based on a crystallization of a first precursor material of the one or more first precursor structures; subsequently, forming one or more second precursor structures over the one or more first remanent-polarizable structures; forming one or more second remanent-polarizable structures may include a crystalline remanent-polarizable material based on a crystallization of a second precursor material of the one or more second precursor structures; and forming a second electrode over the one or more second remanent-polarizable structures.

In Example 61, any one of the examples 38 to 60 may optionally include that the one or more first precursor structures are disposed adjacent to (e.g., in direct physical contact with), wherein the one or more second precursor structures are disposed adjacent to (e.g., in direct physical contact with) the second electrode.

In Example 61, any one of the examples 38 to 60 may optionally include that each of the one or more first and/or second precursor structures has a first dimension in a range from about 1 nm to 100 nm and a second dimension in a range from about 1 nm to about 30 nm.

According to various aspects, a precursor structure, as referred to herein, may include one or more patterned and/or unpatterned layers, patterned and/or unpatterned portions of one or more precursor materials. In some aspects, a precursor material may be any material or mixture of materials that allows for a formation of a crystalline remanent-polarizable material, e.g., by crystallization via a thermal treatment. In some aspects, a precursor structure may include at least a portion of an amorphous material. The amorphous material may be crystallized to thereby form a crystalline remanent-polarizable material, e.g., by crystallization via a thermal treatment.

According to various aspects, the precursor material may include a non-remanent-polarizable material. In other aspects, the precursor material may include a remanent-polarizable material that is different (e.g., with respect to chemical composition, with respect to the respective crystal structure, with respect to the respective microstructure, as examples) from the crystalline remanent-polarizable material.

According to various aspects, a stress layer may be used to support and/or induced the formation of a crystalline remanent-polarizable material from the precursor material. In some aspects, the precursor structure may be directly covered with the stress layer, e.g., the sidewalls and the top surface of the precursor structure may be directly covered with the stress layer. The bottom surface of the precursor structure may be adjacent to the bottom electrode. In other aspects, at least the one or more sidewalls of precursor structure may be directly covered with the stress layer. The top surface and the bottom surface of the precursor structure may be adjacent to the top electrode and bottom electrode respectively.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of forming one or more remanent-polarizable capacitive structures, the method comprising:
   forming one or more capacitive structures, each of the one or more capacitive structures comprises:
   one or more electrodes,
   one or more precursor structures disposed adjacent to the one or more electrodes,
   wherein each of the one or more precursor structures has a first dimension in a range from about 1 nm to 100 nm and a second dimension in a range from about 1 nm to about 30 nm; and, subsequently,
      forming one or more remanent-polarizable structures comprising a crystalline remanent-polarizable material based on a crystallization of a precursor material of the one or more precursor structures,
      wherein forming the one or more capacitive structures comprises:
      forming a layer stack, the layer stack comprising one or more electrode layers and a precursor layer disposed adjacent to the one or more electrode layers, and structuring the layer stack to form the one or more precursor structures from the precursor layer.

2. The method according to claim 1,
   wherein the precursor material comprises a non-remanent-polarizable material, or
   wherein the precursor material comprises a remanent-polarizable material that is different from the crystalline remanent-polarizable material.

3. The method according to claim 1,
   wherein the crystallization is initiated by at least one thermal treatment.

4. The method according to claim 1,
   wherein the crystalline remanent-polarizable material has a single grain structure.

5. The method according to claim 1, further comprising:
   before the crystallization of the precursor material, forming a dielectric structure, the dielectric structure contacts and at least partially surrounds the one or more precursor structures.

6. The method according to claim 1,
   wherein structuring the layer stack comprises forming one or more capacitors, each of the one or more capacitors comprising one or more electrodes formed from the one or more electrode layers, and each of the one or more capacitors comprising a respective precursor structure of the one or more precursor structures.

7. The method according to claim 6,
   wherein each of the one or more capacitors comprises a first electrode and a second electrode, wherein the respective precursor structure is disposed between the first electrode and the second electrode, and wherein a dielectric structure at least partially encapsulates the respective precursor structure, the first electrode and the second electrode.

8. The method according to claim 1,
   wherein the one or more precursor structures comprise at least two precursor structures,
   wherein each of the one or more capacitive structures comprises a first electrode and a second electrode, and
   wherein structuring the layer stack comprises forming a capacitor, the capacitor comprising the first electrode, the second electrode, and the at least two precursor structures disposed between the first electrode and the second electrode.

9. The method according to claim 1,
   wherein the one or more precursor structures comprise a first precursor structure and a second precursor structure, wherein a spacing is provided between the first precursor structure and the second precursor structure, and/or
   wherein the one or more remanent-polarizable structures comprise a first remanent-polarizable structure and a second remanent-polarizable structure, wherein a spacing is provided between the first remanent-polarizable structure and the second remanent-polarizable structure.

10. The method according to claim 9, further comprising:
    forming a dielectric structure in the spacing between the first precursor structure and the second precursor structure.

11. The method according to claim 1,
    wherein the precursor layer comprises at least one material that is, at least subsequent to the crystallization process, remanently polarizable.

12. The method according to claim 1,
    wherein each of the one or more precursor structures has a third dimension in a range from about 1 nm to 100 nm, the third dimension being substantially perpendicular to the first dimension and substantially perpendicular to the second dimension.

13. The method according to claim 1,
    wherein a maximal volume of each of the one or more precursor structures is equal to or less than $0.0003 \, \mu m^3$.

14. A method of forming one or more memory cells, the method comprising:
    forming one or more field-effect transistor structures, each of the one or more field-effect transistor structures comprising a gate electrode; and
    forming one or more remanent-polarizable capacitive structures according to claim 1;
    wherein a respective gate electrode of each of the one or more field-effect transistor structures is coupled to at least one corresponding remanent-polarizable capacitive structure of the one or more remanent-polarizable capacitive structures.

15. A memory cell arrangement comprising:
    a plurality of memory cells distributed over a carrier; each memory cell of the plurality of memory cells comprising:
    a remanent-polarizable capacitive structure comprising a first electrode, a second electrode, and multiple remanent-polarizable structures, wherein the multiple remanent polarizable structures are separated from one another and wherein the multiple remanent polarizable structures are disposed between and in direct physical contact with both the first electrode and the second electrode, each of the multiple remanent-polarizable structures comprising a remanent-polarizable material having a single grain structure with a crystallographic orientation;

wherein, for all memory cell of the plurality of memory cells, the crystallographic orientations of the single grain structures are aligned into substantially the same direction.

16. The memory cell arrangement according to claim 15, wherein the multiple remanent-polarizable structures comprises at least two remanent-polarizable structures, and wherein a spacing is formed between respectively neighboring portions of the at least two remanent-polarizable structures.

17. A method of forming one or more remanent-polarizable capacitive structures, the method comprising:

forming one or more capacitive structures, each of the one or more capacitive structures comprises:

one or more electrodes, one or more precursor structures disposed adjacent to the one or more electrodes; and, subsequently, forming one or more remanent-polarizable structures comprising a crystalline remanent-polarizable material based on a crystallization of a precursor material of the one or more precursor structures, wherein forming the one or more capacitive structures comprises:

forming a layer stack, the layer stack comprising one or more electrode layers and a precursor layer disposed adjacent to the one or more electrode layers, and structuring the layer stack to form the one or more precursor structures from the precursor layer.

18. The method according to claim 17, further comprising subsequent to forming one or more capacitive structures:

forming a cover layer over the one or more capacitive structures, the cover layer covering at least one surface of the one or more precursor structures.

19. The method according to claim 18, wherein each of the one or more precursor structures has a first dimension in a range from about 1 nm to 100 nm and a second dimension in a range from about 1 nm to about 30 nm.

* * * * *